US011538662B2

(12) United States Patent
Ulrich

(10) Patent No.: US 11,538,662 B2
(45) Date of Patent: Dec. 27, 2022

(54) IMPEDANCE MATCHING NETWORK AND METHOD WITH REDUCED MEMORY REQUIREMENTS

(71) Applicant: Reno Technologies, Inc., Wilmington, DE (US)

(72) Inventor: Michael Gilliam Ulrich, Delran, NJ (US)

(73) Assignee: Reno Technologies, Inc.

( * ) Notice: Subject to any disclaimer, the term of this patent is extended or adjusted under 35 U.S.C. 154(b) by 398 days.

(21) Appl. No.: 16/879,928

(22) Filed: May 21, 2020

(65) Prior Publication Data

US 2020/0373127 A1    Nov. 26, 2020

Related U.S. Application Data

(60) Provisional application No. 62/850,589, filed on May 21, 2019.

(51) Int. Cl.
  *H03H 7/40*  (2006.01)
  *H01J 37/32*  (2006.01)
     (Continued)

(52) U.S. Cl.
  CPC ........ *H01J 37/32183* (2013.01); *C23C 16/50* (2013.01); *H01J 37/3299* (2013.01);
     (Continued)

(58) Field of Classification Search
  CPC ............. H01J 37/32183; H01J 37/3299; H01J 2237/24495; H01J 2237/24564;
     (Continued)

(56) References Cited

U.S. PATENT DOCUMENTS 3,828,281 A    8/1974  Chambers
4,110,700 A    8/1978  Rosen et al.
       (Continued)

FOREIGN PATENT DOCUMENTS

EP       0840349         5/1998
EP       0840350         5/1998
WO    WO 2006096589   9/2006

OTHER PUBLICATIONS

Navigator II Matching Networks with a Solid-State Technology Option, Advanced Energy Industries, Inc. 2012, Exhibit 106, pp. 1-1.

(Continued)

*Primary Examiner* — Stephen E. Jones
(74) *Attorney, Agent, or Firm* — The Belles Group, P.C.

(57) ABSTRACT

In one embodiment, the present disclosure is directed to a method for impedance matching. A matching network includes first and second reactance elements configured to provide variable positions. A first parameter of the matching network is determined based on a detected value. The method determines first two-port parameters from a first one-dimensional array that corresponds to a first portion of the matching network using the first reactance element position, and second two-port parameters from a second one-dimensional array that corresponds to a second portion of the matching network using the second reactance element position. An output parameter is calculated based on the first parameter, the first two-port parameters, and the second two-port parameters. New first and second reactance element positions are determined from a match position table using the calculated output parameter. The method then alters the reactance elements accordingly to reduce a reflected power.

20 Claims, 15 Drawing Sheets

(51) Int. Cl.
*H01L 21/66* (2006.01)
*C23C 16/50* (2006.01)
*H03H 7/38* (2006.01)

(52) U.S. Cl.
CPC ........ *H01J 37/32935* (2013.01); *H01L 22/14* (2013.01); *H01L 22/20* (2013.01); *H01L 22/26* (2013.01); *H03H 7/38* (2013.01); *H03H 7/40* (2013.01); *H01J 2237/24495* (2013.01); *H01J 2237/24564* (2013.01)

(58) Field of Classification Search
CPC .......... H01J 2237/332; H01J 2237/334; H01L 22/14; H01L 22/20; H01L 22/26; H03H 7/38; H03H 7/40; H03H 11/28; H03H 11/30
See application file for complete search history.

(56) References Cited

U.S. PATENT DOCUMENTS

| | | | |
|---|---|---|---|
| 4,679,007 | A | 7/1987 | Reese et al. |
| 4,692,643 | A | 9/1987 | Tokunaga et al. |
| 4,751,408 | A | 6/1988 | Rambert |
| 4,929,855 | A | 5/1990 | Ezzeddine |
| 5,012,123 | A | 4/1991 | Ayasli et al. |
| 5,079,507 | A | 1/1992 | Ishida et al. |
| 5,654,679 | A | 8/1997 | Mavretic et al. |
| 5,815,047 | A | 9/1998 | Sorensen et al. |
| 5,849,136 | A | 12/1998 | Mintz et al. |
| 5,880,921 | A | 3/1999 | Tham et al. |
| 5,889,252 | A | 3/1999 | Williams et al. |
| 5,971,591 | A | 10/1999 | Vona et al. |
| 6,046,641 | A | 4/2000 | Chawla et al. |
| 6,137,367 | A | 10/2000 | Ezzedine et al. |
| 6,252,354 | B1 | 6/2001 | Collins et al. |
| 6,259,334 | B1 | 7/2001 | Howald |
| 6,400,012 | B1 | 6/2002 | Miller et al. |
| 6,424,232 | B1 | 7/2002 | Mavretic et al. |
| 6,472,822 | B1 | 10/2002 | Chen et al. |
| 6,583,572 | B2 | 6/2003 | Veltrop et al. |
| 6,621,372 | B2 | 9/2003 | Kondo et al. |
| 6,657,395 | B2 | 12/2003 | Windhorn |
| 6,677,828 | B1 | 1/2004 | Harnett et al. |
| 6,703,080 | B2 | 3/2004 | Reyzelman et al. |
| 6,791,274 | B1 | 9/2004 | Hauer et al. |
| 6,794,951 | B2 | 9/2004 | Finley |
| 6,818,562 | B2 | 11/2004 | Todorow et al. |
| 6,887,339 | B1 | 5/2005 | Goodman et al. |
| 6,888,313 | B2 | 5/2005 | Blackburn et al. |
| 6,888,396 | B2 | 5/2005 | Hajimiri et al. |
| 6,946,847 | B2 | 9/2005 | Nishimori et al. |
| 6,967,547 | B2 | 11/2005 | Pellegrini et al. |
| 7,004,107 | B1 | 2/2006 | Raoux et al. |
| RE39,051 | E | 3/2006 | Harnett |
| 7,071,786 | B2 | 7/2006 | Inoue et al. |
| 7,095,178 | B2 | 8/2006 | Nakano et al. |
| 7,113,761 | B2 | 9/2006 | Bickham et al. |
| 7,122,965 | B2 | 10/2006 | Goodman |
| 7,164,236 | B2 | 1/2007 | Mitrovic et al. |
| 7,199,678 | B2 | 4/2007 | Matsuno |
| 7,251,121 | B2 | 7/2007 | Bhutta |
| 7,298,091 | B2 | 11/2007 | Pickard et al. |
| 7,298,128 | B2 | 11/2007 | Bhutta |
| 7,304,438 | B2 | 12/2007 | Kishinevsky |
| 7,332,981 | B2 | 2/2008 | Matsuno |
| 7,439,610 | B2 | 10/2008 | Weigand |
| 7,480,571 | B2 | 1/2009 | Howald et al. |
| 7,495,524 | B2 | 2/2009 | Omae et al. |
| 7,498,908 | B2 | 3/2009 | Gurov |
| 7,514,935 | B2 | 4/2009 | Pankratz |
| 7,518,466 | B2 | 4/2009 | Sorensen et al. |
| 7,535,312 | B2 | 5/2009 | McKinzie, III |
| 7,602,127 | B2 | 10/2009 | Coumou |
| 7,642,879 | B2 | 1/2010 | Matsuno |
| 7,666,464 | B2 | 2/2010 | Collins et al. |
| 7,714,676 | B2 | 5/2010 | McKinzie, III |
| 7,728,602 | B2 | 6/2010 | Valcore et al. |
| 7,745,955 | B2 | 6/2010 | Kirchmeier et al. |
| 7,755,300 | B2 | 7/2010 | Kishinevsky et al. |
| 7,764,140 | B2 | 7/2010 | Nagarkatti et al. |
| 7,777,567 | B2 | 8/2010 | Polizze |
| 7,839,223 | B2 | 11/2010 | Van Zyl et al. |
| 7,852,170 | B2 | 12/2010 | McKinzie, III |
| 7,863,996 | B2 | 1/2011 | Cotter et al. |
| 7,868,556 | B2 | 1/2011 | Xia |
| 7,872,523 | B2 | 1/2011 | Sivakumar et al. |
| 7,917,104 | B2 | 3/2011 | Manssen et al. |
| 7,969,096 | B2 | 6/2011 | Chen |
| 8,008,982 | B2 | 8/2011 | McKinzie, III |
| 8,040,068 | B2 | 10/2011 | Coumou et al. |
| RE42,917 | E | 11/2011 | Hauer et al. |
| 8,089,026 | B2 | 1/2012 | Sellers |
| 8,102,954 | B2 | 1/2012 | Coumou |
| 8,110,991 | B2 | 2/2012 | Coumou |
| 8,203,859 | B2 | 6/2012 | Omae et al. |
| 8,217,731 | B2 | 7/2012 | McKinzie, III |
| 8,217,732 | B2 | 7/2012 | McKinzie, III |
| 8,228,112 | B2 | 7/2012 | Reynolds |
| 8,237,501 | B2 | 8/2012 | Owen |
| 8,264,154 | B2 | 9/2012 | Banner et al. |
| 8,278,909 | B2 | 10/2012 | Fletcher |
| 8,289,029 | B2 | 10/2012 | Coumou |
| 8,299,867 | B2 | 10/2012 | McKinzie, III |
| 8,314,561 | B2 | 11/2012 | Fisk et al. |
| 8,330,432 | B2 | 12/2012 | Van Zyl et al. |
| 8,334,657 | B2 | 12/2012 | Xia |
| 8,334,700 | B2 | 12/2012 | Coumou et al. |
| 8,335,479 | B2 | 12/2012 | Koya et al. |
| 8,344,559 | B2 | 1/2013 | Van Zyl et al. |
| 8,344,801 | B2 | 1/2013 | Owen et al. |
| 8,368,308 | B2 | 2/2013 | Banna et al. |
| 8,368,469 | B2 | 2/2013 | Mohammadi et al. |
| 8,395,322 | B2 | 3/2013 | Coumou |
| 8,416,008 | B2 | 4/2013 | Van Zyl et al. |
| 8,436,643 | B2 | 5/2013 | Mason |
| 8,461,842 | B2 | 6/2013 | Thuringer et al. |
| 8,466,736 | B1 | 6/2013 | Reynolds |
| 8,487,706 | B2 | 7/2013 | Li et al. |
| 8,502,689 | B2 | 8/2013 | Chen et al. |
| 8,513,889 | B2 | 8/2013 | Zhang et al. |
| 8,520,413 | B2 | 8/2013 | Tran et al. |
| 8,536,636 | B2 | 9/2013 | Englekirk |
| 8,552,665 | B2 | 10/2013 | Larson et al. |
| 8,558,633 | B2 | 10/2013 | McKinzie, III |
| 8,559,907 | B2 | 10/2013 | Burgener et al. |
| 8,564,381 | B2 | 10/2013 | McKinzie |
| 8,569,842 | B2 | 10/2013 | Weis et al. |
| 8,576,010 | B2 | 11/2013 | Yanduru |
| 8,576,013 | B2 | 11/2013 | Coumou |
| 8,587,321 | B2 | 11/2013 | Chen et al. |
| 8,620,236 | B2 | 12/2013 | Manssen et al. |
| 8,624,501 | B2 | 1/2014 | Nagarkatti et al. |
| 8,633,782 | B2 | 1/2014 | Nagarkatti et al. |
| 8,638,159 | B2 | 1/2014 | Ranta et al. |
| 8,649,754 | B2 | 2/2014 | Burgener et al. |
| 8,659,335 | B2 | 2/2014 | Nagarkatti et al. |
| 8,674,606 | B2 | 3/2014 | Carter et al. |
| 8,680,928 | B2 | 3/2014 | Jeon et al. |
| 8,686,796 | B2 | 4/2014 | Presti |
| 8,710,926 | B2 | 4/2014 | Nagarkatti et al. |
| 8,716,984 | B2 | 5/2014 | Mueller et al. |
| 8,723,423 | B2 | 5/2014 | Hoffman et al. |
| 8,742,669 | B2 | 6/2014 | Carter et al. |
| 8,773,019 | B2 | 7/2014 | Coumou et al. |
| 8,779,859 | B2 | 7/2014 | Su et al. |
| 8,781,415 | B1 | 7/2014 | Coumou et al. |
| 8,815,329 | B2 | 8/2014 | Ilic et al. |
| 8,847,561 | B2 | 9/2014 | Karlieek et al. |
| 8,884,180 | B2 | 11/2014 | Ilic et al. |
| 8,884,525 | B2 | 11/2014 | Hoffman et al. |
| 8,890,537 | B2 | 11/2014 | Valcore, Jr. et al. |
| 8,912,835 | B2 | 12/2014 | Nagarkatti et al. |
| 8,928,329 | B2 | 1/2015 | Downing et al. |

(56) References Cited

U.S. PATENT DOCUMENTS

| | | |
|---|---|---|
| 9,083,343 B1 | 7/2015 | Li et al. |
| 9,190,993 B1 | 11/2015 | Li |
| 9,306,533 B1 | 4/2016 | Anton |
| 10,269,540 B1 | 4/2019 | Carter et al. |
| 10,483,946 B1 | 11/2019 | Hrivnak et al. |
| 2002/0048960 A1 | 4/2002 | Scanlan et al. |
| 2002/0060914 A1 | 5/2002 | Porter et al. |
| 2003/0007372 A1 | 1/2003 | Porter et al. |
| 2003/0046013 A1 | 3/2003 | Gerrish |
| 2006/0170367 A1 | 8/2006 | Bhutta |
| 2006/0198077 A1 | 9/2006 | Bhutta |
| 2006/0232471 A1 | 10/2006 | Coumou |
| 2007/0075784 A1 | 4/2007 | Pettersson et al. |
| 2007/0139122 A1 | 6/2007 | Nagarkatti et al. |
| 2008/0179948 A1 | 7/2008 | Nagarkatti et al. |
| 2008/0180179 A1 | 7/2008 | Polizzo |
| 2008/0197854 A1 | 8/2008 | Valcore et al. |
| 2009/0207537 A1 | 8/2009 | Coumou |
| 2010/0001796 A1 | 1/2010 | Sivakumar et al. |
| 2010/0073104 A1 | 3/2010 | Cotter et al. |
| 2010/0123502 A1 | 5/2010 | Bhutta et al. |
| 2010/0194195 A1 | 8/2010 | Coumou et al. |
| 2010/0201370 A1 | 8/2010 | Coumou et al. |
| 2010/0231296 A1 | 9/2010 | Nagarkatti et al. |
| 2011/0241781 A1 | 10/2011 | Owen et al. |
| 2011/0247696 A1 | 10/2011 | Zolock et al. |
| 2012/0013253 A1 | 1/2012 | Coumou |
| 2012/0062322 A1 | 3/2012 | Owen |
| 2012/0188007 A1 | 7/2012 | Van Zyl et al. |
| 2012/0262064 A1 | 10/2012 | Nagarkatti et al. |
| 2013/0043854 A1 | 2/2013 | Tran et al. |
| 2013/0169359 A1 | 7/2013 | Coumou |
| 2013/0193867 A1 | 8/2013 | Van Zyl et al. |
| 2013/0207738 A1 | 8/2013 | Mason |
| 2013/0222055 A1 | 8/2013 | Coumou et al. |
| 2013/0257311 A1 | 10/2013 | Tran et al. |
| 2013/0314163 A1 | 11/2013 | Costa |
| 2013/0320853 A1 | 12/2013 | Carter et al. |
| 2014/0009248 A1 | 1/2014 | Granger-Jones |
| 2014/0028389 A1 | 1/2014 | Coumou |
| 2014/0028398 A1 | 1/2014 | Owen |
| 2014/0049250 A1 | 2/2014 | Brown et al. |
| 2014/0055034 A1 | 2/2014 | Coumou |
| 2014/0061156 A1 | 3/2014 | Brouk et al. |
| 2014/0062303 A1 | 3/2014 | Hoffman et al. |
| 2014/0097908 A1 | 4/2014 | Fisk, II et al. |
| 2014/0117861 A1 | 5/2014 | Finley et al. |
| 2014/0117872 A1 | 5/2014 | Finley |
| 2014/0118031 A1 | 5/2014 | Rughoonundon et al. |
| 2014/0210345 A1 | 7/2014 | Hoffman |
| 2014/0210551 A1 | 7/2014 | Mueller |
| 2014/0218076 A1 | 8/2014 | Coumou et al. |
| 2014/0220913 A1 | 8/2014 | Coumou et al. |
| 2014/0231243 A1 | 8/2014 | Finley |
| 2014/0232266 A1 | 8/2014 | Finley et al. |
| 2014/0266492 A1 | 9/2014 | Radomski et al. |
| 2014/0306742 A1 | 10/2014 | Menzer et al. |
| 2014/0320013 A1 | 10/2014 | Coumou et al. |
| 2015/0115289 A1 | 4/2015 | Fursin et al. |
| 2018/0076788 A1 | 3/2018 | Decker et al. |
| 2019/0214232 A1 | 7/2019 | Morii et al. |
| 2019/0272978 A1 | 9/2019 | Bhutta et al. |

OTHER PUBLICATIONS

Frenzel E. Louis, Jectronic Design, Back to Basics: Impedance Matching (Part 1), Advanced Energy Industries, Inc., Exhibit 1009, pp. 1-10, 2011.

Frenzel E. Louis, Jectronic Design, Back to Basics: Impedance Matching (Part 2), Advanced Energy Industries, Inc. Exhibit 1010, pp. 1-9, 2012.

Frenzel E. Louis, Jectronic Design, Back to Basics: Impedance Matching (Part 3), Advanced Energy Industries, Inc., Exhibit 1011, pp. 1-7, 2012.

Analog Devices, 10MHz, Four-Quadrant Multiplier/Divider AD734, Advanced Energy Industries, Inc., 2011, Exhibit 1018, pp. 1-20.

Analog Devices, Dual Ultrafast Voltage Comparator ADCMP566, Advanced Energy Industries, Inc., 2003, Exhibit 1019, pp. 1-16.

Analog Devices, 10-Bit, 105 MSPS/125 MSPS/150 MSPS, 1.8 V Dual Analog-to-Digital Converter AD9600, Advanced Energy Industries, Inc., 2007-2009, Exhibit 1020, pp. 1-72.

Analog Devices, LF-2.7 GHz RF/IF Gain and Phase Detector AD8302, Advanced Energy Industries, Inc., 2002, Exhibit 1020, pp. 1-24.

Todorow, Valentin., Impedance Matching and Matching Networks, Advanced Energy Industries, Inc., 2009, Exhibit 1008, pp. 1-27.

IMPEDANCE MATCHING NETWORK AND METHOD WITH REDUCED MEMORY REQUIREMENTS

CROSS REFERENCE TO RELATED APPLICATIONS

The present application claims the benefit of U.S. Provisional Patent Application No. 62/850,589 filed May 21, 2019, which is incorporated herein by reference in its entirety.

BACKGROUND

The semiconductor device fabrication process uses plasma processing at different stages of fabrication to make a semiconductor device such as a microprocessor, a memory chip, or another integrated circuit or device. Plasma processing involves energizing a gas mixture by imparting energy to the gas molecules by the introduction of RF (radio frequency) energy into the gas mixture. This gas mixture is typically contained in a vacuum chamber, also called a plasma chamber, and the RF energy is introduced through electrodes or other means in the chamber. In a typical plasma process, the RF generator generates power at the desired RF frequency and power, and this power is transmitted through the RF cables and networks to the plasma chamber.

To provide efficient transfer of power from the RF generator to the plasma chamber, an RF matching network is positioned between the RF generator and the plasma chamber. The purpose of the RF matching network is to transform the plasma impedance to a value suitable for the RF generator. In many cases, particularly in the semiconductor fabrication processes, the RF power is transmitted through 50 Ohm coaxial cables and the system impedance (output impedance) of the RF generators is also 50 Ohm. On the other hand, the impedance of the plasma, driven by the RF power, varies. The impedance on the input side of the RF matching network must be transformed to non-reactive 50 Ohm (i.e., 50+j0) for maximum power transmission. RF matching network perform this task of continuously transforming the plasma impedance to 50 Ohm for the RF generator.

A typical RF matching network is composed of variable capacitors and a microprocessor-based control circuit to control the capacitors. The value and size of the variable capacitors are influenced by the power handling capability, frequency of operation, and impedance range of the plasma chamber. The predominant variable capacitor in use in RF matching networks is the vacuum variable capacitor (VVC). The VVC is an electromechanical device, consisting of two concentric metallic rings that move in relation to each other to change the capacitance. In complex semiconductor processes, where the impedance changes are very rapid, the rapid and frequent movements put stresses on the VVC leading to their failures. VVC-based RF matching networks are one of the last electromechanical components in the semiconductor fabrication process.

As semiconductor devices shrink in size and become more complex, however, the feature geometries become very small. As a result, the processing time to fabricate these features becomes small, typically in the 5-6 second range. Current RF matching networks take 1-2 seconds to tune the process and this results in unstable process parameters for a significant portion of the process time. Electronically variable capacitor (EVC) technology (see, e.g., U.S. Pat. No. 7,251,121, incorporated herein by reference) enables a reduction in this semiconductor processing tune time from 1-2 seconds to less than 500 seconds. EVC-based matching networks are a type of solid state matching network. Their decreased tune time greatly increases the available stable processing time, thereby improving yield and performance.

While EVC technology is known, it has yet to be developed into an industry-accepted replacement for VVCs. However, because an EVC is purely an electronic device, an EVC is not a one-for-one replacement for a VVC in an RF matching network. Further advancements are therefore needed to more fully take advantage of using EVCs as part of an RF matching network.

BRIEF SUMMARY

In one aspect, a method of matching an impedance includes a) operably coupling a radio frequency (RF) input of a matching network to an RF source, and operably coupling an RF output of the matching network to a plasma chamber, wherein the matching network comprises i) a first reactance element configured to provide a variable first reactance element position, the first reactance element position controlling the total reactance provided by the first reactance element; and ii) a second reactance element configured to provide a variable second reactance element position, the second reactance element position controlling the total reactance provided by the second reactance element; b) detecting, by a sensor, a value related to the plasma chamber or the matching network; c) determining a first parameter of the matching network based on the detected value; d) determining first two-port parameters from a first one-dimensional array that corresponds to a first portion of the matching network using the first reactance element position; e) determining second two-port parameters from a second one-dimensional array that corresponds to a second portion of the matching network using the second reactance element position, the second portion of the matching network being distinct from the first portion; f) calculating an output parameter of the RF output based on the first parameter, the first two-port parameters, and the second two-port parameters; g) determining a new first reactance element position and a new second reactance element position from a match position table using the calculated output parameter; and h) altering the first reactance element to the new first reactance element position, and altering the second reactance element to the new second reactance element position to reduce a reflected power.

In another aspect, an impedance matching network includes an RF input configured to operably couple to an RF source; an RF output configured to operably couple to a plasma chamber; a first reactance element configured to provide a variable first reactance element position, the first reactance element position controlling the total reactance provided by the first reactance element; a second reactance element configured to provide a variable second reactance element position, the second reactance element position controlling the total reactance provided by the second reactance element; a control circuit configured to carry out a matching process of detecting, by a sensor, a value related to the plasma chamber or the matching network; determining a first parameter of the matching network based on the detected value; determining first two-port parameters from a first one-dimensional array that corresponds to a first portion of the matching network using the first reactance element position; determining second two-port parameters from a second one-dimensional array that corresponds to a second portion of the matching network using the second reactance element position, the second portion of the matching network being distinct from the first portion; calculating an output parameter of the RF output based on the first parameter, the first two-port parameters, and the second two-port parameters; determining a new first reactance element position and a new second reactance element position from a match position table using the calculated output parameter; and altering the first reactance element to the new first reactance element position, and altering the second reactance element to the new second reactance element position to reduce a reflected power.

In yet another embodiment, a semiconductor processing tool comprises a plasma chamber configured to deposit a material onto a substrate or etch a material from the substrate; and an impedance matching network operably coupled to the plasma chamber, the matching network comprising the features of the matching network described above.

In yet another embodiment, a method of manufacturing a semiconductor comprises placing a substrate in a plasma chamber configured to deposit a material layer onto the substrate or etch a material layer from the substrate; and carrying out the impedance matching steps of the method of matching an impedance described above.

BRIEF DESCRIPTION OF THE DRAWINGS

The present disclosure will become more fully understood from the detailed description and the accompanying drawings, wherein.

DETAILED DESCRIPTION

Figure 1:
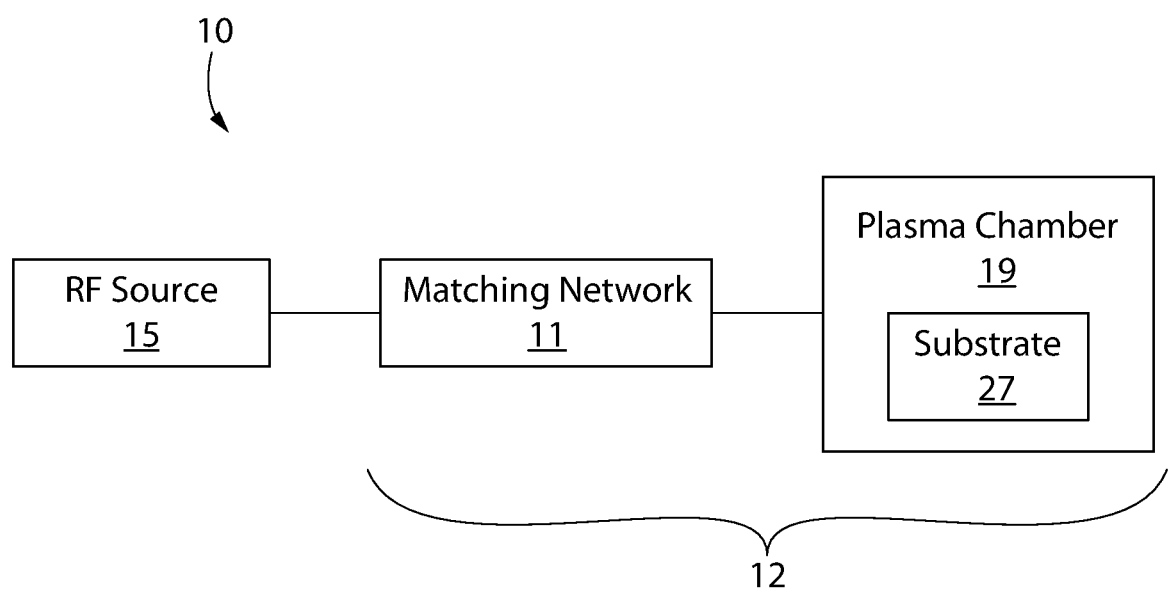
FIG. 1 is a block diagram of an embodiment of a semiconductor processing system.

The following description of the preferred embodiment(s) is merely exemplary in nature and is in no way intended to limit the invention or inventions. The description of illustrative embodiments is intended to be read in connection with the accompanying drawings, which are to be considered part of the entire written description. In the description of the exemplary embodiments disclosed herein, any reference to direction or orientation is merely intended for convenience of description and is not intended in any way to limit the scope of the present inventions. The discussion herein describes and illustrates some possible non-limiting combinations of features that may exist alone or in other combinations of features. Furthermore, as used herein, the term "or" is to be interpreted as a logical operator that results in true whenever one or more of its operands are true. Furthermore, as used herein, the phrase "based on" is to be interpreted as meaning "based at least in part on," and therefore is not limited to an interpretation of "based entirely on."

Features of the present inventions may be implemented in software, hardware, firmware, or combinations thereof. The computer programs described herein are not limited to any particular embodiment, and may be implemented in an operating system, application program, foreground or background processes, driver, or any combination thereof. The computer programs may be executed on a single computer or server processor or multiple computer or server processors.

Processors described herein may be any central processing unit (CPU), microprocessor, micro-controller, computational, or programmable device or circuit configured for executing computer program instructions (e.g., code). Various processors may be embodied in computer and/or server hardware of any suitable type (e.g., desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc.

Computer-executable instructions or programs (e.g., software or code) and data described herein may be programmed into and tangibly embodied in a non-transitory computer-readable medium that is accessible to and retrievable by a respective processor as described herein which configures and directs the processor to perform the desired functions and processes by executing the instructions encoded in the medium. A device embodying a programmable processor configured to such non-transitory computer-executable instructions or programs may be referred to as a "programmable device", or "device", and multiple programmable devices in mutual communication may be referred to as a "programmable system." It should be noted that non-transitory "computer-readable medium" as described herein may include, without limitation, any suitable volatile or non-volatile memory including random access memory (RAM) and various types thereof, read-only memory (ROM) and various types thereof, USB flash memory, and magnetic or optical data storage devices (e.g., internal/external hard disks, floppy discs, magnetic tape CD-ROM, DVD-ROM, optical disk, ZIP™ drive, Blu-ray disk, and others), which may be written to and/or read by a processor operably connected to the medium.

In certain embodiments, the present invention may be embodied in the form of computer-implemented processes and apparatuses such as processor-based data processing and communication systems or computer systems for practicing those processes. The present invention may also be embodied in the form of software or computer program code embodied in a non-transitory computer-readable storage medium, which when loaded into and executed by the data processing and communications systems or computer systems, the computer program code segments configure the processor to create specific logic circuits configured for implementing the processes.

As used throughout, ranges are used as shorthand for describing each and every value that is within the range. Any value within the range can be selected as the terminus of the range. In addition, all references cited herein are hereby incorporated by referenced in their entireties. In the event of a conflict in a definition in the present disclosure and that of a cited reference, the present disclosure controls.

In the following description, where circuits are shown and described, one of skill in the art will recognize that, for the sake of clarity, not all peripheral circuits or components are shown in the figures or described in the description. Further, the terms "couple" and "operably couple" can refer to a direct or indirect coupling of two components of a circuit.

The following description of the preferred embodiment(s) is merely exemplary in nature and is in no way intended to limit the invention or inventions. The description of illustrative embodiments is intended to be read in connection with the accompanying drawings, which are to be considered part of the entire written description. In the description of the exemplary embodiments disclosed herein, any reference to direction or orientation is merely intended for convenience of description and is not intended in any way to limit the scope of the present invention. Relative terms such as "lower," "upper," "horizontal," "vertical," "above," "below," "up," "down," "left," "right," "top," "bottom," "front" and "rear" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," "secured" and other similar terms refer to a relationship wherein structures are secured or attached to one another either directly or indirectly through intervening structures, as well as both movable or rigid attachments or relationships, unless expressly described otherwise. The discussion herein describes and illustrates some possible non-limiting combinations of features that may exist alone or in other combinations of features. Furthermore, as used herein, the term "or" is to be interpreted as a logical operator that results in true whenever one or more of its operands are true. Furthermore, as used herein, the phrase "based on" is to be interpreted as meaning "based at least in part on," and therefore is not limited to an interpretation of "based entirely on."

As used throughout, ranges are used as shorthand for describing each and every value that is within the range. Any value within the range can be selected as the terminus of the range. In addition, all references cited herein are hereby incorporated by referenced in their entireties. In the event of a conflict in a definition in the present disclosure and that of a cited reference, the present disclosure controls.

Semiconductor Processing System

Referring to FIG. 1, a semiconductor device processing system 5 utilizing an RF generator 15 is shown. The system 10 includes an RF generator 15 and a semiconductor processing tool 12. The semiconductor processing tool 12 includes a matching network 11 and a plasma chamber 19. In other embodiments, the generator 15 or other power source can form part of the semiconductor processing tool.

The semiconductor device can be a microprocessor, a memory chip, or other type of integrated circuit or device. A substrate 27 can be placed in the plasma chamber 19, where the plasma chamber 19 is configured to deposit a material layer onto the substrate 27 or etch a material layer from the substrate 27. Plasma processing involves energizing a gas mixture by imparting energy to the gas molecules by introducing RF energy into the gas mixture. This gas mixture is typically contained in a vacuum chamber (the plasma chamber 19), and the RF energy is typically introduced into the plasma chamber 19 through electrodes. Thus, the plasma can be energized by coupling RF power from an RF source 15 into the plasma chamber 19 to perform deposition or etching.

In a typical plasma process, the RF generator 15 generates power at a radio frequency—which is typically within the range of 3 kHz and 300 GHz—and this power is transmitted through RF cables and networks to the plasma chamber 19. In order to provide efficient transfer of power from the RF generator 15 to the plasma chamber 19, an intermediary circuit is used to match the fixed impedance of the RF generator 15 with the variable impedance of the plasma chamber 19. Such an intermediary circuit is commonly referred to as an RF impedance matching network, or more simply as an RF matching network. The purpose of the RF matching network 11 is to transform the variable plasma impedance to a value that more closely matches the fixed impedance of the RF generator 15. Commonly owned U.S. patent application Ser. No. 14/669,568, the disclosure of which is incorporated herein by reference in its entirety, provides an example of such a matching network.

Matching Network

Figure 2:
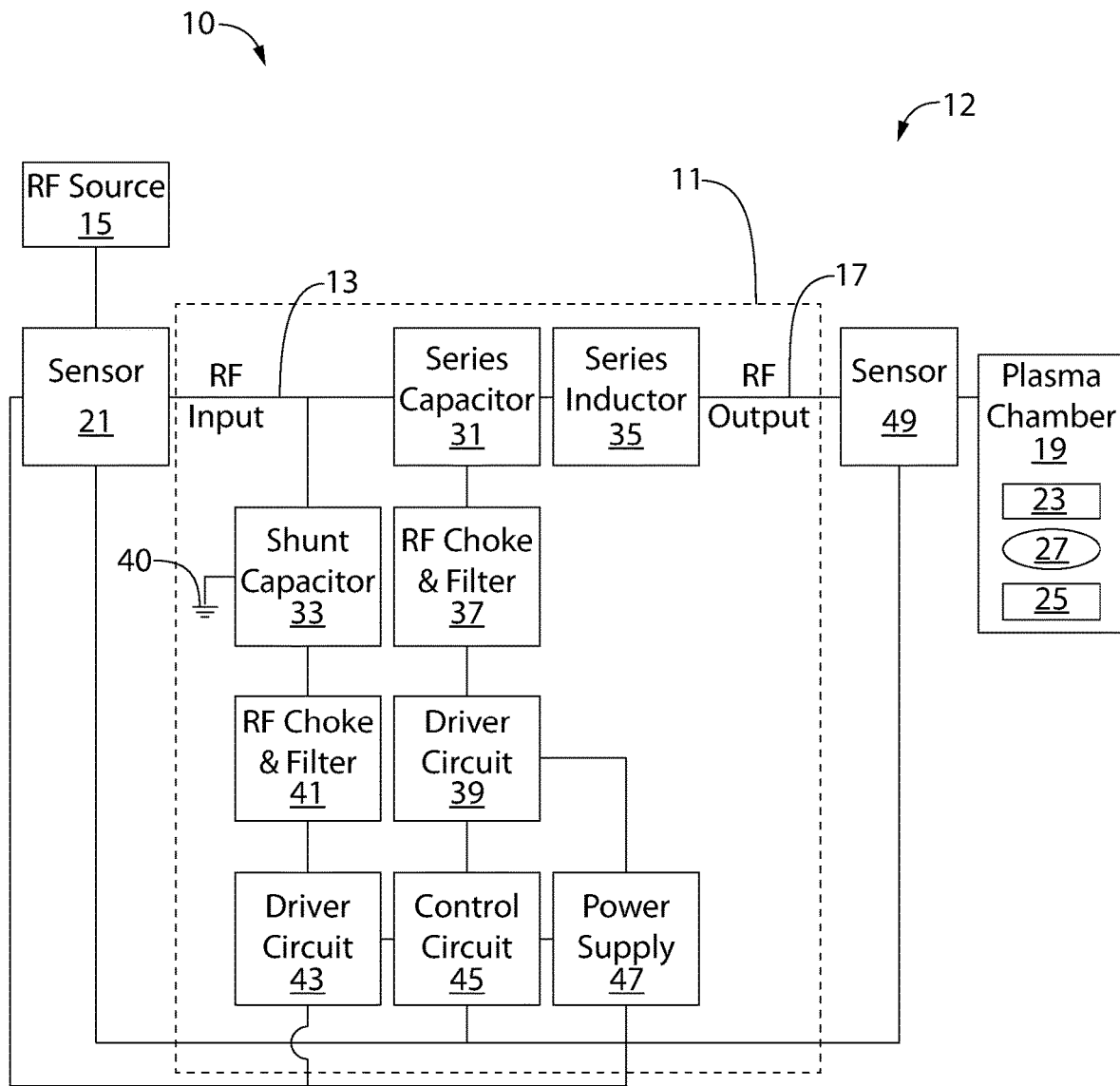
FIG. 2 is a block diagram of an embodiment of a semiconductor processing system having an L-configuration matching network.

FIG. 2 is a block diagram of an embodiment of a semiconductor processing system 10 having a processing tool 12 that includes an L-configuration RF impedance matching network 11. The matching network 11 has an RF input 13 connected to an RF source 15 and an RF output 17 connected to a plasma chamber 19. An RF input sensor 21 can be connected between the RF impedance matching network 11 and the RF source 15. An RF output sensor 49 can be connected between the RF impedance matching network 11 and the plasma chamber 19 so that the RF output from the impedance matching network, and the plasma impedance presented by the plasma chamber 19, may be monitored. Certain embodiments may include only one of the input sensor 21 and the output sensor 49. The functioning of these sensors 21, 49 are described in greater detail below.

As discussed above, the RF impedance matching network 11 serves to help maximize the amount of RF power transferred from the RF source 15 to the plasma chamber 19 by matching the impedance at the RF input 13 to the fixed impedance of the RF source 15. The matching network 11 can consist of a single module within a single housing designed for electrical connection to the RF source 15 and plasma chamber 19. In other embodiments, the components of the matching network 11 can be located in different housings, some components can be outside of the housing, and/or some components can share a housing with a component outside the matching network.

As is known in the art, the plasma within a plasma chamber 19 typically undergoes certain fluctuations outside of operational control so that the impedance presented by the plasma chamber 19 is a variable impedance. Since the variable impedance of the plasma chamber 19 cannot be fully controlled, and an impedance matching network may be used to create an impedance match between the plasma chamber 19 and the RF source 15. Moreover, the impedance of the RF source 15 may be fixed at a set value by the design of the particular RF source 15. Although the fixed impedance of an RF source 15 may undergo minor fluctuations during use, due to, for example, temperature or other environmental variations, the impedance of the RF source 15 is still considered a fixed impedance for purposes of impedance matching because the fluctuations do not significantly vary the fixed impedance from the originally set impedance value. Other types of RF source 15 may be designed so that the impedance of the RF source 15 may be set at the time of, or during, use. The impedance of such types of RF sources 15 is still considered fixed because it may be controlled by a user (or at least controlled by a programmable controller) and the set value of the impedance may be known at any time during operation, thus making the set value effectively a fixed impedance.

The RF source 15 may be an RF generator of a type that is well-known in the art, and generates an RF signal at an appropriate frequency and power for the process performed within the plasma chamber 19. The RF source 15 may be electrically connected to the RF input 13 of the RF impedance matching network 11 using a coaxial cable, which for impedance matching purposes would have the same fixed impedance as the RF source 15.

The plasma chamber 19 includes a first electrode 23 and a second electrode 25, and in processes that are well known in the art, the first and second electrodes 23, 25, in conjunction with appropriate control systems (not shown) and the plasma in the plasma chamber, enable one or both of deposition of materials onto a substrate 27 and etching of materials from the substrate 27.

In the exemplified embodiment, the RF impedance matching network 11 includes a series variable capacitor 31, a shunt variable capacitor 33, and a series inductor 35 to form an 'L' type matching network. The shunt variable capacitor 33 is shown shunting to a reference potential, in this case ground 40, between the series variable capacitor 31 and the series inductor 35, and one of skill in the art will recognize that the RF impedance matching network 11 may be configured with the shunt variable capacitor 33 shunting to a reference potential at the RF input 13 or at the RF output 17.

Figure 3:
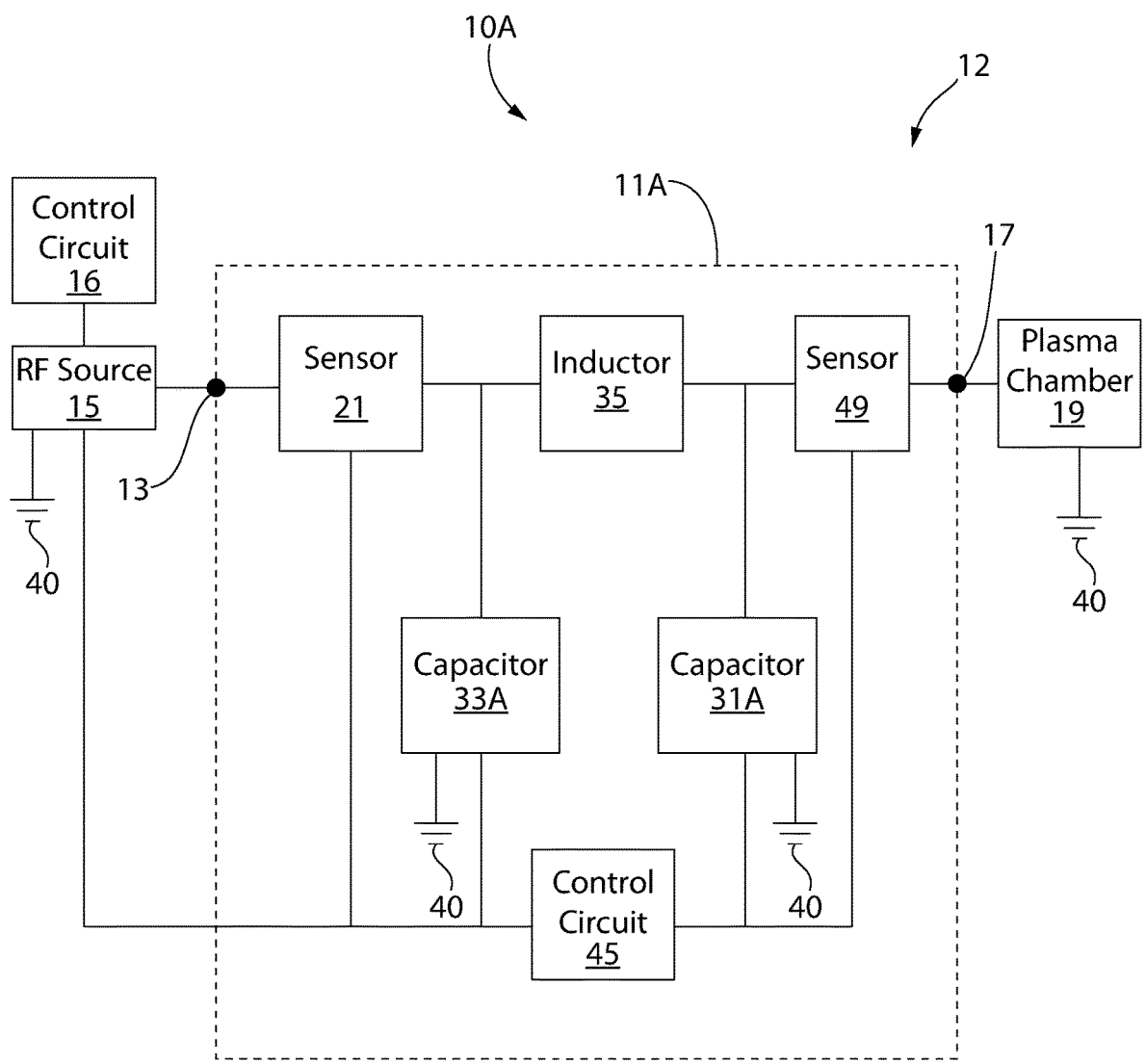
FIG. 3 is a block diagram of an embodiment of a semiconductor processing system having a pi-configuration matching network.

Alternatively, the RF impedance matching network 11 may be configured in other matching network configurations, such as a 'T' type configuration or a 'Π' or 'pi' type configuration, as will be shown in FIG. 3. In certain embodiments, the variable capacitors and the switching circuit described below may be included in any configuration appropriate for an RF impedance matching network.

In the exemplified embodiment, each of the series variable capacitor 31 and the shunt variable capacitor 33 may be an electronic variable capacitor (EVC), as described in U.S. Pat. No. 7,251,121, the EVC being effectively formed as a capacitor array formed by a plurality of discrete capacitors. The series variable capacitor 31 is coupled in series between the RF input 13 and the RF output 17 (which is also in parallel between the RF source 15 and the plasma chamber 19). The shunt variable capacitor 33 is coupled in parallel between the RF input 13 and ground 40. In other configurations, the shunt variable capacitor 33 may be coupled in parallel between the RF output 19 and ground 40. Other configurations may also be implemented without departing from the functionality of an RF matching network. In still other configurations, the shunt variable capacitor 33 may be coupled in parallel between a reference potential and one of the RF input 13 and the RF output 19.

The series variable capacitor 31 is connected to a series RF choke and filter circuit 37 and to a series driver circuit 39. Similarly, the shunt variable capacitor 33 is connected to a shunt RF choke and filter circuit 41 and to a shunt driver circuit 43. Each of the series and shunt driver circuits 39, 43 are connected to a control circuit 45, which is configured with an appropriate processor and/or signal generating circuitry to provide an input signal for controlling the series and shunt driver circuits 39, 43. A power supply 47 is connected to each of the RF input sensor 21, the series driver circuit 39, the shunt driver circuit 43, and the control circuit 45 to provide operational power, at the designed currents and voltages, to each of these components. The voltage levels provided by the power supply 47, and thus the voltage levels employed by each of the RF input sensor 21, the series driver circuit 39, the shunt driver circuit 43, and the control circuit 45 to perform the respective designated tasks, is a matter of design choice. In other embodiments, a variety of electronic components can be used to enable the control circuit 45 to send instructions to the variable capacitors. Further, while the driver circuit and RF choke and filter are shown as separate from the control circuit 45, these components can also be considered as forming part of the control circuit 45.

In the exemplified embodiment, the control circuit 45 includes a processor. The processor may be any type of properly programmed processing device, such as a computer or microprocessor, configured for executing computer program instructions (e.g., code). The processor may be embodied in computer and/or server hardware of any suitable type (e.g., desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc. The processor of the exemplified embodiment is configured with specific algorithms to enable matching network to perform the functions described herein.

With the combination of the series variable capacitor 31 and the shunt variable capacitor 33, the combined impedances of the RF impedance matching network 11 and the plasma chamber 19 may be controlled, using the control circuit 45, the series driver circuit 39, the shunt driver circuit 43, to match, or at least to substantially match, the fixed impedance of the RF source 15.

The control circuit 45 is the brains of the RF impedance matching network 11, as it receives multiple inputs, from sources such as the RF input sensor 21 and the series and shunt variable capacitors 31, 33, makes the calculations necessary to determine changes to the series and shunt variable capacitors 31, 33, and delivers commands to the series and shunt variable capacitors 31, 33 to create the impedance match. The control circuit 45 is of the type of control circuit that is commonly used in semiconductor fabrication processes, and therefore known to those of skill in the art. Any differences in the control circuit 45, as compared to control circuits of the prior art, arise in programming differences to account for the speeds at which the RF impedance matching network 11 is able to perform switching of the variable capacitors 31, 33 and impedance matching.

Each of the series and shunt RF choke and filter circuits 37, 41 are configured so that DC signals may pass between the series and shunt driver circuits 39, 43 and the respective series and shunt variable capacitors 31, 33, while at the same time the RF signal from the RF source 15 is blocked to prevent the RF signal from leaking into the outputs of the series and shunt driver circuits 39, 43 and the output of the control circuit 45. The series and shunt RF choke and filter circuits 37, 41 are of a type known to those of skill in the art.

FIG. 3 is a block diagram of an embodiment of a semiconductor processing system 10A having a pi-configuration matching network 11A, as opposed to the L-configuration matching network of FIG. 2. For ease of understanding, this figure omits the RF chokes and filters, driver circuits, and power supplies of FIG. 2. Where FIG. 3 uses reference numbers identical to those of FIG. 2, it is understood that the relevant components can have features similar to those discussed with regard to FIG. 2.

The most significant difference between the L- and pi-configuration is that the L-configuration utilizes a series capacitor 31 and shunt capacitor 33, while the pi-configuration utilizes two shunt capacitors 31A, 33A. Nevertheless, the control circuit can alter the capacitance of these shunt variable capacitors 31A, 33A to cause an impedance match. Each of these shunt variable capacitors 31A, 33A can be an EVC, as discussed above. They can be controlled by a choke, filter, and driver similar to the methods discussed above with respect to FIG. 2.

EVC Capacitor Arrays

Figure 4:
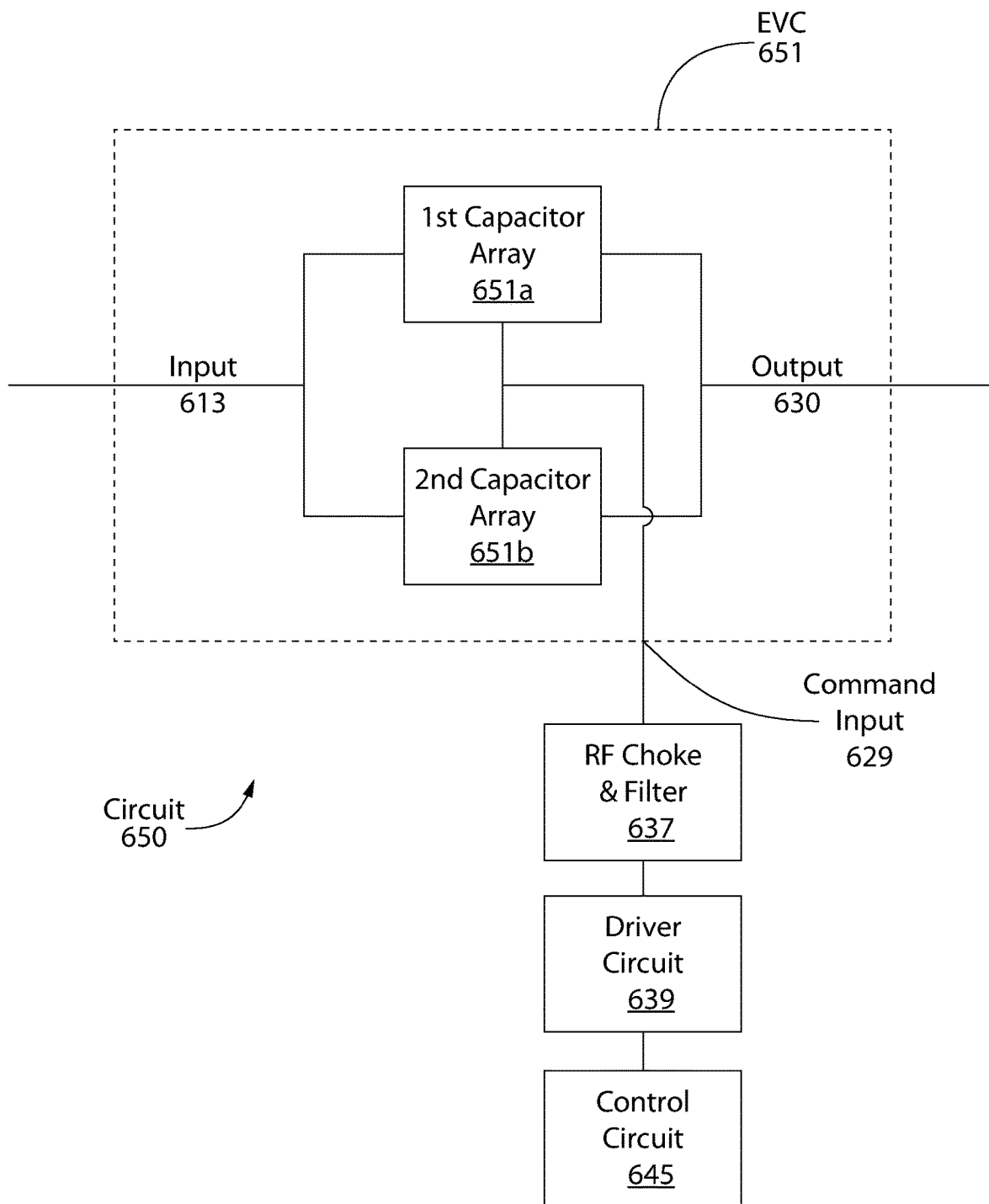
FIG. 4 is a block diagram of an embodiment of an electronic circuit for providing a variable capacitance using an electronically variable capacitor having two capacitor arrays.

FIG. 4 shows an electronic circuit 650 for providing a variable capacitance according to one embodiment. The circuit 650 utilizes an EVC 651 that includes two capacitor arrays 651a, 651b. The first capacitor array 651a has a first plurality of discrete capacitors, each having a first capacitance value. The second capacitor array 651b has a second plurality of discrete capacitors, each having a second capacitance value. The first capacitance value is different from the second capacitance value such that the EVC 651 can provide coarse and fine control of the capacitance produced by the EVC 651. The first capacitor array and the second capacitor array are coupled in parallel between a signal input 613 and a signal output 630.

The first and second capacitance values can be any values sufficient to provide the desired overall capacitance values for the EVC 651. In one embodiment, the second capacitance value is less than or equal to one-half (½) of the first capacitance value. In another embodiment, the second capacitance value is less than or equal to one-third (⅓) of the first capacitance value. In yet another embodiment, the second capacitance value is less than or equal to one-fourth (¼) of the first capacitance value.

The electronic circuit 650 further includes a control circuit 645, which can have features similar to control circuit 45 discussed above. The control circuit 645 is operably coupled to the first capacitor array 651a and to the second capacitor array 651b by a command input 629, the command input 629 being operably coupled to the first capacitor array 651a and to the second capacitor array 651b. In the exemplified embodiment, the command input 629 has a direct electrical connection to the capacitor arrays 651a, 651b, though in other embodiments this connection can be indirect. The coupling of the control circuit 645 to the capacitor arrays 651a, 651b will be discussed in further detail below.

The control circuit 645 is configured to alter the variable capacitance of the EVC 651 by controlling on and off states of (a) each discrete capacitor of the first plurality of discrete capacitors and (b) each discrete capacitor of the second plurality of discrete capacitors. As stated above, the control circuit 645 can have features similar to those described with respect to control circuit 45 of FIGS. 2-3. For example, the control circuit 645 can receive inputs from the capacitor arrays 651a, 651b, make calculations to determine changes to capacitor arrays 651a, 651b, and delivers commands to the capacitor arrays 651a, 651b for altering the capacitance of the EVC 651. EVC 651 of FIG. 4 can include a plurality of electronic switches. Each electronic switch can be configured to activate and deactivate one or more discrete capacitors. The EVCs different positions or configurations are controlled by which discrete capacitors are switched in and which discrete capacitors are switched out.

As with the control circuit 45 of FIGS. 2-3, the control circuit 645 can also be connected to a driver circuit 639 and an RF choke and filter circuit 637. The control circuit 645, driver circuit 639, and RF choke and filter circuit 637 can have capabilities similar to those discussed with regard to FIG. 2-3. In the exemplified embodiment, the driver circuit 639 is operatively coupled between the control circuit 645 and the first and second capacitor arrays 651a, 651b. The driver circuit 639 is configured to alter the variable capacitance based upon a control signal received from the control circuit 645. The RF filter 637 is operatively coupled between the driver circuit 639 and the first and second capacitor arrays 651a, 651b. In response to the control signal sent by the control unit 645, the driver circuit 639 and RF filter 637 are configured to send a command signal to the command input 629. The command signal is configured to alter the variable capacitance by instructing at least one of the electronic switches to activate or deactivate (a) at least one the discrete capacitors of the first plurality of discrete capacitors or (b) at least one of the discrete capacitors of the second plurality of discrete capacitors.

In the exemplified embodiment, the driver circuit 639 is configured to switch a high voltage source on or off in less than 15 μsec, the high voltage source controlling the electronic switches of each of the first and second capacitor arrays for purposes of altering the variable capacitance. The EVC 651, however, can be switched by any of the means or speeds discussed in the present application.

The control circuit 645 can be configured to calculate coarse and fine capacitance values to be provided by the respective capacitor arrays 651a, 651b. In the exemplified embodiment, the control circuit 645 is configured to calculate a coarse capacitance value to be provided by controlling the on and off states of the first capacitor array 651a. Further, the control circuit is configured to calculate a fine capacitance value to be provided by controlling the on and off states of the second capacitor array 651b. In other embodiments, the capacitor arrays 651a, 651b can provide alternative levels of capacitance. In other embodiments, the EVC can utilize additional capacitor arrays.

EVC 651 of FIG. 4 can be used in most systems requiring a varying capacitance. For example, EVC 651 can be used as the series EVC and/or shunt EVC in matching network 11 of FIG. 2, or as one or both of the shunt EVCs in matching network 11A of FIG. 3. It is often desired that the differences between the capacitance values allow for both a sufficiently fine resolution of the overall capacitance of the circuit and a wide range of capacitance values to enable a better impedance match at the input of a RF matching network, and EVC 651 allows this.

EVC 651 can also be used in a system or method for fabricating a semiconductor, a method for controlling a variable capacitance, and/or a method of controlling an RF impedance matching network. Such methods can include altering at least one of the series variable capacitance and the shunt variable capacitance to the determined series capacitance value and the shunt capacitance value, respectively. This altering can be accomplishing by controlling, for each of the series EVC and the shunt EVC, on and off states of each discrete capacitor of each plurality of discrete capacitors. In other embodiments, EVC 651 and circuit 650 can be used in other methods and systems to provide a variable capacitance.

Switching in and Out Discrete Capacitors to Vary EVC Capacitance

As discussed above, an EVC is a type of variable capacitor that can use multiple switches, each used to create an open or short circuit, with individual series capacitors to change the capacitance of the variable capacitor. The switches can be mechanical (such as relays) or solid state (such as PIN diodes, transistors, or other switching devices). The following is a discussion of methods for setting up an EVC or other variable capacitor to provide varying capacitances.

In what is sometimes referred to as an "accumulative setup" of an EVC or other variable capacitor, the approach to linearly increase the capacitor value from the minimum starting point (where all switches are open) is to incrementally increase the number of fine tune capacitors that are switched into the circuit. Once the maximum number of fine tune capacitors is switched into circuit, a coarse tune capacitor is switched in, and the fine tune capacitors are switched out. The process starts over with increasing the number of fine tune capacitors that are switched into circuit, until all fine and coarse tune capacitors are switched in, at which point another coarse tune capacitor is switched in and the fine tune capacitors are switched out. This process can continue until all the coarse and fine capacitors are switched in.

In this embodiment, all of the fine tune capacitors have the same or a substantially similar value, and all the coarse tune capacitors have the same or a substantially similar value. Further, the capacitance value of one coarse tune capacitor about equals the combined capacitance value of all fine tune capacitors plus an additional fine tune capacitor into the circuit, thus enabling a linear increase in capacitance. The embodiments, however, are not so limited. The fine tune capacitors (and coarse capacitors) need not have the same or a substantially similar value. Further, the capacitance value of one coarse tune capacitor need not equal the combined capacitance value of all fine tune capacitors plus an additional fine tune capacitor. In one embodiment, the coarse capacitance value and the fine capacitance value have a ratio substantially similar to 10:1. In another embodiment, the second capacitance value is less than or equal to one-half ($\frac{1}{2}$) of the first capacitance value. In another embodiment, the second capacitance value is less than or equal to one-third ($\frac{1}{3}$) of the first capacitance value. In yet another embodiment, the second capacitance value is less than or equal to one-fourth ($\frac{1}{4}$) of the first capacitance value.

An example of the aforementioned embodiment in an ideal setting would be if the fine tune capacitors were equal to 1 pF, and the coarse tune capacitors were equal to 10 pF. In this ideal setup, when all switches are open, the capacitance is equal to 0 pF. When the first switch is closed, there is 1 pF in the circuit. When the second switch is closed there is 2 pF in the circuit, and so on, until nine fine tune switches are closed, giving 9 pF. Then, the first 10 pF capacitor is switched into circuit and the nine fine tune switches are opened, giving a total capacitance of 10 pF. The fine tune capacitors are then switched into circuit from 11 pF to 19 pF. Another coarse tune capacitor can then be switched into circuit and all fine tune capacitors can be switched out of circuit giving 20 pF. This process can be repeated until the desired capacitance is reached.

This can also be taken one step further. Using the previous example, having nine 1 pF capacitors and also nine 10 pF capacitors, the variable capacitor circuit can have even larger values, 100 pF, to switch in and out of circuit. This would allow the previous capacitor array to go up to 99 pF, and then the 100 pF capacitor can be used for the next increment. This can be repeated further using larger increments, and can also be used with any counting system. According to the accumulative setup, increasing the total capacitance of a variable capacitor is achieved by switching in more of the coarse capacitors or more of the fine capacitors than are already switched in without switching out a coarse capacitor that is already switched in. Further, when the variable total capacitance is increased and the control circuit does not switch in more of the coarse capacitors than are already switched in, then the control circuit switches in more fine capacitors than are already switched in without switching out a fine capacitor that is already switched in.

Figure 5:
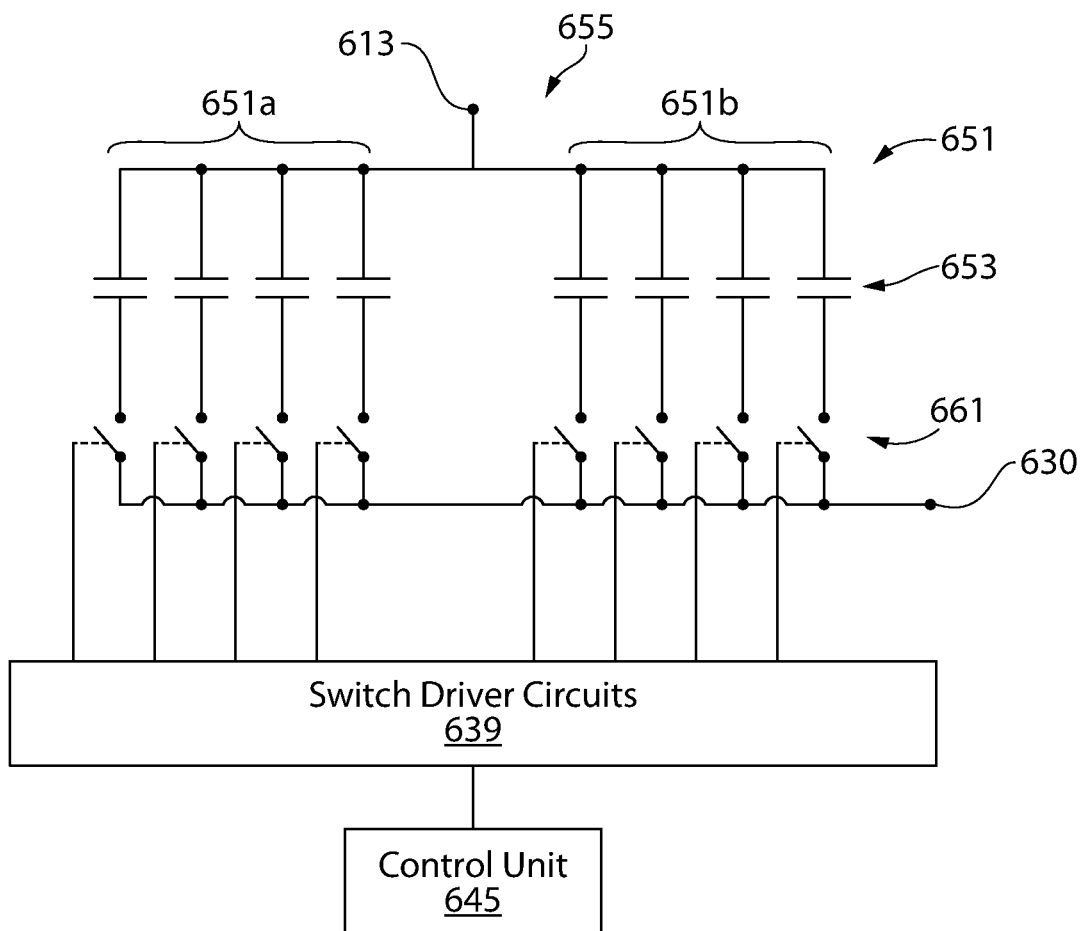
FIG. 5 is a block diagram of an embodiment of a variable capacitance system for switching in and out discrete capacitors of an electronically variable capacitor.

FIG. 5 is a schematic of a variable capacitance system 655 according to an accumulative setup. Where this figure uses reference numbers identical to those of FIG. 4, it is understood that the relevant components can have features similar to those discussed in FIG. 4. The variable capacitance system 655 comprises a variable capacitor 651 for providing a varying capacitance. The variable capacitor 651 has an input 613 and an output 630. The variable capacitor 651 includes a plurality of discrete capacitors 653 operably coupled in parallel. The plurality of capacitors 653 includes first (fine) capacitors 651*a* and second (coarse) capacitors 651B. Further, the variable capacitor 651 includes a plurality of switches 661. Of the switches 661, one switch is operably coupled in series to each of the plurality of capacitors to switch in and out each capacitor, thereby enabling the variable capacitor 651 to provide varying total capacitances. The variable capacitor 651 has a variable total capacitance that is increased when discrete capacitors 653 are switched in and decreased when the discrete capacitors 653 are switched out.

The switches 661 can be coupled to switch driver circuits 639 for driving the switches on and off. The variable capacitance system 655 can further include a control unit 645 operably coupled to the variable capacitor 651. Specifically, the control unit 645 can be operably coupled to the driver circuits 639 for instructing the driver circuits 639 to switch one or more of the switches 661, and thereby turn one or more of the capacitors 653 on or off. In one embodiment, the control unit 645 can form part of a control unit that controls a variable capacitor, such as a control unit that instructs the variable capacitors of a matching network to change capacitances to achieve an impedance match. The driver circuits 639 and control unit 645 can have features similar to those discussed above with reference to FIG. 4, and thus can also utilize an RF choke and filter as discussed above.

In one embodiment, the control circuit 645 is configured to determine a desired coarse capacitance for the coarse capacitors; determine a desired fine capacitance for the fine capacitors; and after calculating the desired coarse capacitance and the desired fine capacitance, alter the total variable capacitance by switching in or out at least one of the fine capacitors; and switching in or out at least one of the coarse capacitors. In other embodiments, coarse tuning and fine tuning can occur at different stages.

In the exemplified embodiment, the first capacitors 651*a* are fine capacitors each having a capacitance value substantially similar to a fine capacitance value, and the second capacitors 651*b* are coarse capacitors each having a capacitance value substantially similar to a coarse capacitance value, the coarse capacitance value being greater than the fine capacitance value. For purposes of this application, capacitances and other values are considered to be substantially similar if one value is not 15 percent (15%) greater than or less than another value.

The variable capacitance system 655 can form part of an impedance matching network, including but not limited to, the impedance matching networks of FIGS. 1-3. The variable capacitance system can also form part of a method for controlling an impedance matching network (such as the impedance matching networks of FIGS. 1-3). The method can include providing the RF impedance matching network comprising determining an increased total capacitance to be provided by one of the EVCs; and increasing the variable total capacitance of the one EVC by switching in more of the coarse capacitors or more of the fine capacitors than are already switched in without switching out a coarse capacitor that is already switched in. Further, the variable capacitance system can form part of a method and system for fabricating a semiconductor (see FIGS. 1-3).

Using the variable capacitance system discussed above with an impedance matching network can provide several advantages over other approaches. An alternative to the above approach would be to have all the capacitor values be different, with the first value equal to the minimum desired change in capacitance. Then each successive capacitor value is increased to double the change in capacitance from the previous up until the maximum desired capacitor value, when all capacitors are switched in. This approach can result in using less capacitors to switch in and out of circuit to achieve the same resolution and range. A potential problem with this setup, however, is that, once the capacitor reaches a certain value, the voltage and/or current on that particular capacitor or the current on the switch can be higher than the specification allows for. This forces the EVC to use multiple capacitors in parallel for each switch of lower value. This problem is particularly acute where high voltages and/or currents are being used. The accumulative setup discussed above avoids putting this degree of stress on its capacitors and switches by switching in additional capacitors, rather than replacing lower-capacitance capacitors with higher-capacitance capacitors.

Determining Capacitance Values to Achieve Match

Figure 6:
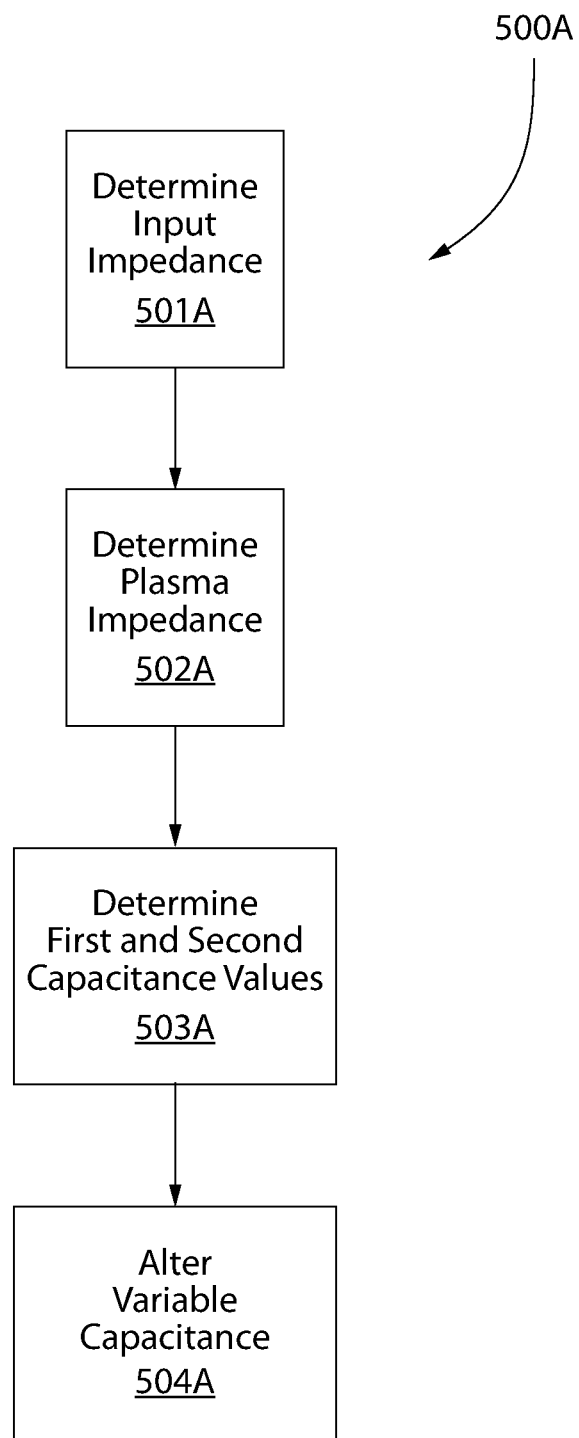
FIG. 6 is a flow chart showing an embodiment of a process for matching an impedance by altering a variable capacitance.

FIG. 6 is a flow chart showing a process 500A for matching an impedance according to one embodiment. The matching network can include components similar to those discussed above. In one embodiment, the matching network of FIG. 2 is utilized. In the first step of the exemplified process 500A of FIG. 6, an input impedance at the RF input 13 is determined (step 501A). The input impedance is based on the RF input parameter detected by the RF input sensor 21 at the RF input 13. The RF input sensor 21 can be any sensor configured to detect an RF input parameter at the RF input 13. The input parameter can be any parameter measurable at the RF input 13, including a voltage, a current, or a phase at the RF input 13. In the exemplified embodiment, the RF input sensor 21 detects the voltage, current, and phase at the RF input 13 of the matching network 11. Based on the RF input parameter detected by the RF input sensor 21, the control circuit 45 determines the input impedance.

Next, the control circuit 45 determines the plasma impedance presented by the plasma chamber 19 (step 502A). In one embodiment, the plasma impedance determination is based on the input impedance (determined in step 501A), the capacitance of the series EVC 31, and the capacitance of the shunt EVC 33. In other embodiments, the plasma impedance determination can be made using the output sensor 49 operably coupled to the RF output, the RF output sensor 49 configured to detect an RF output parameter. The RF output parameter can be any parameter measurable at the RF output 17, including a voltage, a current, or a phase at the RF output 17. The RF output sensor 49 may detect the output parameter at the RF output 17 of the matching network 11. Based on the RF output parameter detected by the RF output sensor 21, the control circuit 45 may determine the plasma impedance. In yet other embodiments, the plasma impedance determination can be based on both the RF output parameter and the RF input parameter.

Once the variable impedance of the plasma chamber 19 is known, the control circuit 45 can determine the changes to make to the variable capacitances of one or both of the series and shunt EVCs 31, 33 for purposes of achieving an impedance match. Specifically, the control circuit 45 determines a first capacitance value for the series variable capacitance and a second capacitance value for the shunt variable capacitance (step 503A). These values represent the new capacitance values for the series EVC 31 and shunt EVC 33 to enable an impedance match, or at least a substantial impedance match. In the exemplified embodiment, the determination of the first and second capacitance values is based on the variable plasma impedance (determined in step 502A) and the fixed RF source impedance.

Once the first and second capacitance values are determined, the control circuit 45 generates a control signal to alter at least one of the series variable capacitance and the shunt variable capacitance to the first capacitance value and the second capacitance value, respectively (step 504A). This is done at approximately t=−5 μsec. The control signal instructs the switching circuit to alter the variable capacitance of one or both of the series and shunt EVCs 31, 33.

This alteration of the EVCs 31, 33 takes about 9-11 μsec total, as compared to about 1-2 sec of time for an RF matching network using VVCs. Once the switch to the different variable capacitances is complete, there is a period of latency as the additional discrete capacitors that make up the EVCs join the circuit and charge. This part of the match tune process takes about 55 μsec. Finally, the RF power profile 403 is shown decreasing, at just before t=56 μsec, from about 380 mV peak-to-peak to about 100 mV peak-to-peak. This decrease in the RF power profile 403 represents the decrease in the reflected power 407, and it takes place over a time period of about 10 μsec, at which point the match tune process is considered complete.

The altering of the series variable capacitance and the shunt variable capacitance can comprise sending a control signal to the series driver circuit 39 and the shunt driver circuit 43 to control the series variable capacitance and the shunt variable capacitance, respectively, where the series driver circuit 39 is operatively coupled to the series EVC 31, and the shunt driver circuit 43 is operatively coupled to the shunt EVC 43. When the EVCs 31, 33 are switched to their desired capacitance values, the input impedance may match the fixed RF source impedance (e.g., 50 Ohms), thus resulting in an impedance match. If, due to fluctuations in the plasma impedance, a sufficient impedance match does not result, the process of 500A may be repeated one or more times to achieve an impedance match, or at least a substantial impedance match.

Using an RF matching network 11, such as that shown in FIG. 2, the input impedance can be represented as follows:

$$Z_{in} = \frac{(Z_P + Z_L + Z_{series})Z_{shunt}}{Z_P + Z_L + Z_{series} + Z_{shunt}}$$

where $Z_{in}$ is the input impedance, $Z_P$ is the plasma impedance, $Z_L$ is the series inductor impedance, $Z_{series}$ is the series EVC impedance, and $Z_{shunt}$ is the shunt EVC impedance. In the exemplified embodiment, the input impedance ($Z_{in}$) is determined using the RF input sensor 21. The EVC impedances ($Z_{series}$ and $Z_{shunt}$) are known at any given time by the control circuitry, since the control circuitry is used to command the various discrete capacitors of each of the series and shunt EVCs to turn ON or OFF. Further, the series inductor impedance ($Z_L$) is a fixed value. Thus, the system can use these values to solve for the plasma impedance ($Z_P$).

Based on this determined plasma impedance ($Z_P$) and the known desired input impedance ($Z_{in}'$) (which is typically 50 Ohms), and the known series inductor impedance ($Z_L$), the system can determine a new series EVC impedance ($Z_{series}'$) and shunt EVC impedance $Z_{shunt}'$).

$$Z_{in}' = \frac{(Z_P + Z_L + Z_{series}')Z_{shunt}'}{Z_P + Z_L + Z_{series}' + Z_{shunt}'}$$

Based on the newly calculated series EVC variable impedance ($Z_{series}'$) and shunt EVC variable impedance ($Z_{shunt}'$), the system can then determine the new capacitance value (first capacitance value) for the series variable capacitance and a new capacitance value (second capacitance value) for the shunt variable capacitance. When these new capacitance values are used with the series EVC 31 and the shunt EVC 33, respectively, an impedance match may be accomplished.

The exemplified method of computing the desired first and second capacitance values and reaching those values in one step is significantly faster than moving the two EVCs step-by-step to bring either the error signals to zero, or to bring the reflected power/reflection coefficient to a minimum. In semiconductor plasma processing, where a faster tuning scheme is desired, this approach provides a significant improvement in matching network tune speed.

Determining Capacitance Values Using Parameter Matrix

Figure 7:
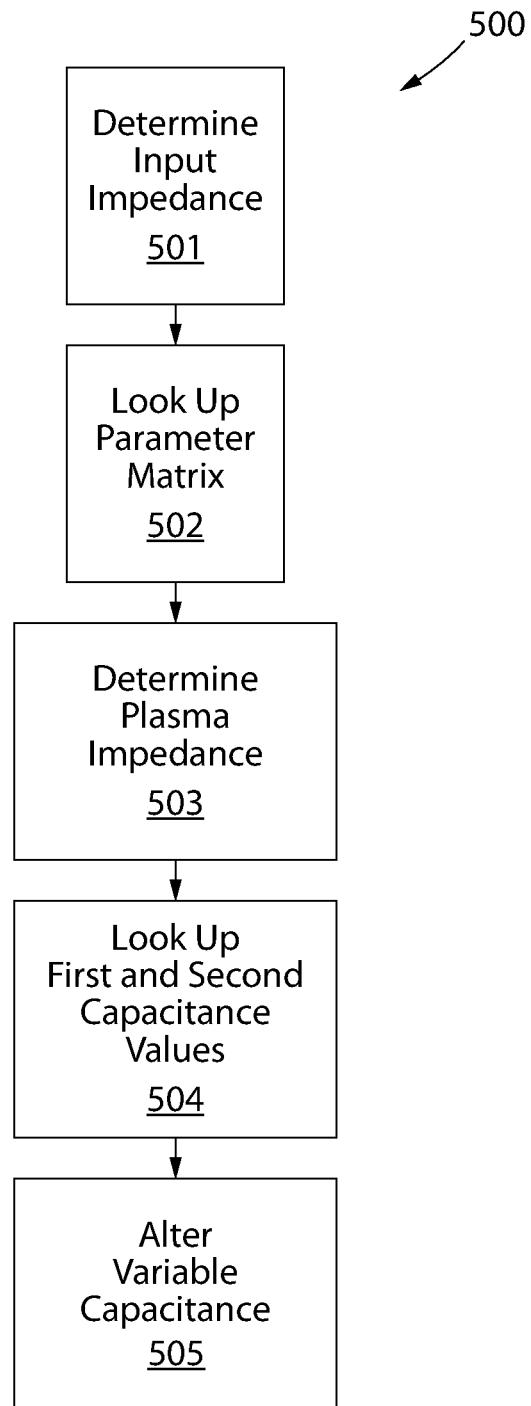
FIG. 7 is a flow chart showing another embodiment of a process for matching an impedance using a parameter matrix to alter a variable capacitance.

FIG. 7 provides an alternative process 500 for matching an impedance that uses a parameter matrix. In the exemplified process, the control circuit 45 (see FIG. 2 for matching network components) is configured and/or programmed to carry out each of the steps. As one of two initial steps, RF parameters are measured at the RF input 13 by the RF input sensor 21, and the input impedance at the RF input 13 is calculated (step 501) using the measured RF parameters. For this exemplified process 500, the forward voltage and the forward current are measured at the RF input 13. In certain other embodiments, the RF parameters may be measured at the RF output 17 by the RF output sensor 49, although in such embodiments, different calculations may be required than those described below. In still other embodiments, RF parameters may be measured at both the RF input 13 and the RF output 17.

The impedance matching circuit, coupled between the RF source 15 and the plasma chamber 19, may be characterized by one of several types of parameter matrices known to those of skill in the art, including two-port parameter matrices. An S-parameter matrix and a Z-parameter matrix are two examples of such parameter matrices. Other examples include, but are not limited to, a Y-parameter matrix, a G-parameter matrix, an H-parameter matrix, a T-parameter matrix, and an ABCD-parameter matrix. Those of skill in the art will recognize also that these various parameter matrices may be mathematically converted from one to the other for an electrical circuit such as a matching network. The second initial step of the exemplified process 500 is to look up (step 502) the parameter matrix for the existing configuration of the impedance matching circuit in a parameter table. The existing configuration of the impedance matching circuit is defined by existing operational parameters of the impedance matching circuit, particularly the existing discrete capacitor array positions for both of the series EVC 31 and the shunt EVC 33. In order to achieve an impedance match, the existing configuration of the impedance matching circuit is altered to a new configuration of the impedance matching circuit as part of the exemplified process 500.

The parameter table includes a plurality of parameter matrices, with each parameter matrix being associated with a particular configuration of the series EVC 31 and the shunt EVC 33. The parameter table may include one or more of the aforementioned types of parameter matrices. In the exemplified process 500, the parameter table includes at least a plurality of S-parameter matrices. In certain embodiments, the parameter table may include at least a plurality of Z-parameter matrices. In embodiments in which the parameter table includes multiple types of parameter matrices, the different types of parameter matrices are associated within the parameter table in such a way so as to eliminate the need for mathematical conversions between the different types of parameter matrices. For example, the T-parameter matrix may be included as part of the parameter table, with each T-parameter matrix associated with the associated S-parameter matrix that would result from conversion between the two matrices.

The input impedance calculation (step 501) and the parameter matrix look up (step 502) may be performed in any order. With the input impedance calculated (step 501) and the parameter matrix for the existing configuration of the impedance matching circuit identified within the parameter table (step 502) done, the plasma or load impedance may then be calculated (step 503) using the calculated input impedance and the parameter matrix for the existing configuration. Next, from the calculated plasma impedance, the match positions for the series EVC 31 and the shunt EVC 33 that would achieve an impedance match, or at least a substantial impedance match, between the RF source 15 and the plasma chamber 19 are looked up (step 504) in a match position table. These match positions from the match position table are the discrete capacitor positions that will result in new capacitance values for the series EVC 31 and shunt EVC 33, with an impedance match being achieved with the new capacitor positions and associated new capacitance values. The match position table is a table of capacitor positions for the series EVC 31 and the shunt EVC 33, and it includes each possible capacitor position of the series EVC 31 and the shunt EVC 33 when used in combination. As an alternative to using an match position table, the actual capacitance values for the EVCs 31, 33 may be calculated during the process—however, such real-time calculations of the capacitance values are inherently slower than looking up the match positions in the match position table. After the match positions for the series EVC 31 and the shunt EVC 33 are identified in the match position table, then one or both of the series capacitor position and the shunt capacitor position are altered (step 505) to the respective identified match positions for the series EVC 31 and the shunt EVC 33.

The altering (step 505) of the series capacitor position and the shunt capacitor position may include the control circuit 45 sending a control signal to the series driver circuit 39 and the shunt driver circuit 43 to control the series capacitor position and the shunt capacitor position, respectively, where the series driver circuit 39 is operatively coupled to the series EVC 31, and the shunt driver circuit 43 is operatively coupled to the shunt EVC 43. When the EVCs 31, 33 are switched to the match positions, the input impedance may match the fixed RF source impedance (e.g., 50 Ohms), thus resulting in an impedance match. If, due to fluctuations in the plasma impedance, a sufficient impedance match does not result, the process of 500 may be repeated one or more times to achieve an impedance match, or at least a substantial impedance match.

The lookup tables used in the process described above are compiled in advance of the RF matching network being used in conjunction with the plasma chamber 19. In creating the lookup tables, the RF matching network 11 is tested to determine at least one parameter matrix of each type and the load impedance associated with each capacitor position of the series EVC 31 and the shunt EVC 33 prior to use with a plasma chamber. The parameter matrices resulting from the testing are compiled into the parameter table so that at least one parameter matrix of each type is associated with a respective capacitor position of the EVCs 31, 33. Similarly, the load impedances are compiled into the match position table so that each parameter matrix is associated with a respective capacitor position of the EVCs 31, 33. The pre-compiled lookup tables may take into consideration the fixed RF source impedance (e.g., 50 Ohms), the power output of the RF source, and the operational frequency of the RF source, among other factors that are relevant to the operation of the RF matching network. Each table may therefore have tens of thousands of entries, or more, to account for all the possible positions of the EVCs 31, 33. The number of possible positions is primarily determined by how many discrete capacitors make up each of the EVCs 31, 33. In compiling the lookup tables, consideration may be given to possible safety limitations, such as maximum allowed voltages and currents at critical locations inside the matching network, and this may serve to exclude entries in one or more of the lookup tables for certain positions of the EVCs 31, 33.

As is known in the art, the S-parameter matrix is composed of components called scatter parameters, or S-parameters for short. An S-parameter matrix for the impedance matching circuit has four S-parameters, namely $S_{11}$, $S_{12}$, $S_{21}$, and $S_{22}$, each of which represents a ratio of voltages at the RF input 13 and the RF output 17. All four of the S-parameters for the impedance matching circuit are determined and/or calculated in advance, so that the full S-parameter matrix is known. The parameters of the other types of parameter matrices may be similarly determined and/or calculated in advance and incorporated into the parameter matrix. For example, a Z-parameter matrix for the impedance matching circuit has four Z-parameters, namely $Z_{11}$, $Z_{12}$, $Z_{21}$, and $Z_{22}$.

By compiling the parameter table in this manner, the entire time cost of certain calculations occurs during the testing phase for the RF matching network, and not during actual use of the RF matching network 11 with a plasma chamber 19. Moreover, because locating a value in a lookup table can take less time than calculating that same value in real time, using the lookup table can aid in reducing the overall time needed to achieve an impedance match. In a plasma deposition or etching process which includes potentially hundreds or thousands of impedance matching adjustments throughout the process, this time savings can help add directly to cost savings for the overall fabrication process.

From the beginning of the match tune process, which starts with the control circuit determining the variable impedance of the plasma chamber and determining the series and shunt match positions, to the end of the match tune process, when the RF power reflected back toward the RF source decreases, the entire match tune process of the RF impedance matching network using EVCs has an elapsed time of approximately 110 μsec, or on the order of about 150 μsec or less. This short elapsed time period for a single iteration of the match tune process represents a significant increase over a VVC matching network. Moreover, because of this short elapsed time period for a single iteration of the match tune process, the RF impedance matching network using EVCs may iteratively perform the match tune process, repeating the two determining steps and the generating another control signal for further alterations to the capacitor positions of one or both of the electronically variable capacitors. By iteratively repeating the match tune process, it is anticipated that a better impedance match may be created within about 2-4 iterations of the match tune process. Moreover, depending upon the time it takes for each repetition of the match tune process, it is anticipated that 3-4 iterations may be performed in 500 μsec or less. Given the 1-2 sec match time for a single iteration of a match tune process for RF impedance matching networks using VVCs, this ability to perform multiple iterations in a fraction of the time represents a significant advantage for RF impedance matching networks using EVCs.

Those of skill in the art will recognize that several factors may contribute to the sub-millisecond elapsed time of the impedance matching process for an RF impedance matching network using EVCs. Such factors may include the power of the RF signal, the position and design of the EVCs, the type of matching network being used, and the type and configuration of the driver circuit being used. Other factors not listed may also contribute to the overall elapsed time of the impedance matching process. Thus, it is expected that the entire match tune process for an RF impedance matching network having EVCs should take no more than about 500 μsec to complete from the beginning of the process (i.e., measuring by the control circuit and calculating adjustments needed to create the impedance match) to the end of the process (the point in time when the efficiency of RF power coupled into the plasma chamber is increased due to an impedance match and a reduction of the reflected power). Even at a match tune process on the order of 500 μsec, this process time still represents a significant improvement over RF impedance matching networks using VVCs.

Table 1 presents data showing a comparison between operational parameters of one example of an EVC versus one example of a VVC. As can be seen, EVCs present several advantages, in addition to enabling fast switching for an RF impedance matching network:

TABLE 1

| Parameter | EVC | Typical 1000 pF Vacuum Capacitors |
|---|---|---|
| Capacitance | 20 pF~1400 pF | 15 pF~1000 pF |
| Reliability | High | Low |
| Response Time | ~500 μsec | 1 s~2 s |
| ESR | ~13 mW | ~20 mW |
| Voltage | 7 kV | 5 kV |
| Current Handling Capability | 216 A rms | 80 A rms |
| Volume | 4.5 in³ | 75 in³ |

As is seen, in addition to the fast switching capabilities made possible by the EVC, EVCs also introduce a reliability advantage, a current handling advantage, and a size advantage. Additional advantages of the RF impedance matching network using EVCs and/or the switching circuit itself for the EVCs include:

- The disclosed RF impedance matching network does not include any moving parts, so the likelihood of a mechanical failure reduced to that of other entirely electrical circuits which may be used as part of the semiconductor fabrication process. For example, the typical EVC may be formed from a rugged ceramic substrate with copper metallization to form the discrete capacitors. The elimination of moving parts also increases the resistance to breakdown due to thermal fluctuations during use.
- The EVC has a compact size as compared to a VVC, so that the reduced weight and volume may save valuable space within a fabrication facility.
- The design of the EVC introduces an increased ability to customize the RF matching network for specific design needs of a particular application. EVCs may be configured with custom capacitance ranges, one example of which is a non-linear capacitance range. Such custom capacitance ranges can provide better impedance matching for a wider range of processes. As another example, a custom capacitance range may provide more resolution in certain areas of impedance matching. A custom capacitance range may also enable generation of higher ignition voltages for easier plasma strikes.
- The short match tune process (~500 μsec or less) allows the RF impedance matching network to better keep up with plasma changes within the fabrication process, thereby increasing plasma stability and resulting in more controlled power to the fabrication process.
- The use of EVCs, which are digitally controlled, non-mechanical devices, in an RF impedance matching network provides greater opportunity to fine tune control algorithms through programming.
- EVCs exhibit superior low frequency (kHz) performance as compared to VVCs.

Multiple Single-Dimension Arrays

As discussed above, an impedance matching network may be characterized by one of several types of parameter matrices known to those of skill in the art, including two-port parameter matrices. The following example will utilize an S-parameter matrix, though the invention is not so limited, as any parameter matrix may be used (e.g., Z-parameter, Y-parameter, G-parameter, H-parameter, T-parameter, or ABCD-parameter). Taking an S-Map of the matching network (i.e., determining two-port S-parameters for the matching network) can provide the required information to generate lookup tables for tuning. This allows an EVC matching network to tune even faster by adjusting the capacitor to the best tuning state directly in a single step. It is noted that, while the invention is described in the context of using an EVC, the disclosed method for reducing memory requirements can apply to a system using any variable reactance element, including any variable capacitor (such as any mechanically variable capacitor (including a VVC)) and any variable inductor. A variable reactance element can include one or more discrete reactance elements that can be switched in and out to alter a total reactance, where a reactance element is a capacitor or inductor or similar reactive device.

Certain applications require the matching network to cover a large impedance range. With EVC matching networks, the capacitors have quantized states, that is, a fixed number of capacitance values it can provided based on the fixed number of different capacitor positions it can provide with its discrete capacitors. This causes the density of tuning points to go down. This can cause a best tuned position to have a higher than desired VSWR.

There are different approaches for reducing the step size as the tuning area and range increase. See U.S. Patent Pub. No. 2019/0272978, which is incorporated herein by reference in its entirety. With an accumulative setup, where the EVC has coarse-tuning and fine-tuning discrete capacitors, the solution is to simply add more switching capacitors. But this will add size and cost to the matching network. An alternative is to use a partial binary setup for the EVC's discrete capacitors, where the coarse-tuning discrete capacitors are equal in value, typically selected to be at or near the current limit of the switch, while the fine-tuning capacitors are in binary or near-binary step sizes, meaning each discrete capacitor is or about half the value of the former capacitor's value. Thus, if there is one binary capacitor it would be half the value of a coarse capacitor. If smaller step sizes are needed a capacitor can be added that is half the value of the first binary capacitor and so on.

The matching network may use an S-map (or other two-port parameters) to predict the best tune position, where two-port parameters may be measured for each capacitor position. Different approaches are provided below.

Using Multi-Dimension Tables

Figure 8A:
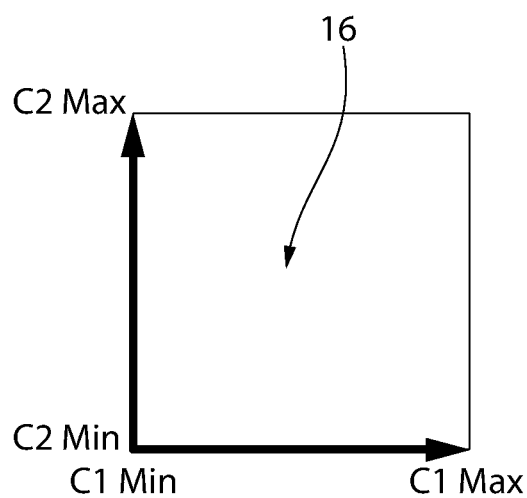
FIG. 8A is a parameter table according to one embodiment.
Figure 8B:
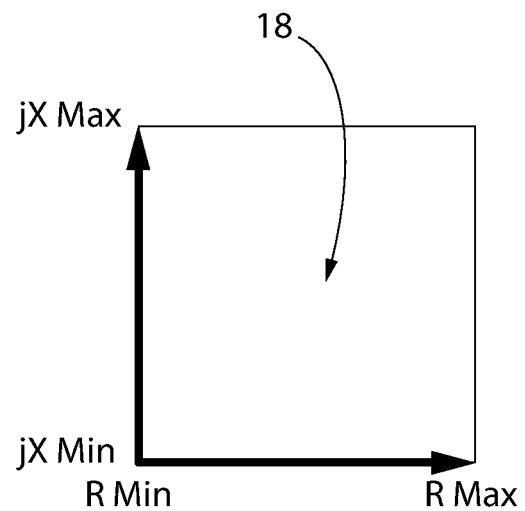
FIG. 8B is a match position table according to one embodiment.

In the embodiment discussed above, two-port parameters are used to generate two tables, namely, a parameter table 16 such as that shown in FIG. 8A, and a match position table 18 such as that shown in FIG. 8B. The parameter table 16 is used to calculate the load impedance, based on the measured input impedance and two-port parameters of the match. The input impedance $Z_{in}$ at the RF input of the matching network can be determined, for example, by a voltage, current, and phase detector, a dual-directional coupler, or another sensor capable of measuring an impedance. The present tune position's two-port parameters, found in the parameter table 16, and the input impedance are used to calculate the load impedance $Z_{load}$ at the RF output of the matching network. As an example, using Z-Parameters to calculate $Z_{load}$ for a matching network using two EVCs is shown in the following equation. A typical matching network would use a two-dimensional table to vary the tuning positions along two axes.

$$Z_{Load} = \frac{Z_{21} Z_{12}}{Z_{11} - Z_{in}} - Z_{22}$$

An example would be a pi matching network 11A of FIG. 3 with two shunt variable capacitors 33A, 31A. As shown in FIG. 8A, in the parameter table 16 one capacitor varies along an x-axis, while the other capacitor varies along a y-axis.

According to this embodiment, with the load impedance calculated, the next step is to find the best tuning position, that is, the best capacitor positions for the EVCs to enable an impedance match. The match position table 18 can be generated using the parameter table 16 and a load impedance range. As shown in FIG. 8B, this table 18 may be two axes of the real load and imaginary load, though the invention is not so limited.

To generate the match position table 18 according to the exemplified embodiment, each predefined load impedance is inserted into the following equation to calculate $Z_{in}$.

$$Z_{in} = Z_{11} - \frac{Z_{21}Z_{12}}{Z_{22} + Z_{Load}}$$

Then, the calculated values for $Z_{in}$ are compared to see which capacitor position gives the best match at the RF input for that load. To make a comparison, a parameter such as gamma Γ is calculated to give a quantified error value for each position. Gamma Γ (the voltage reflection coefficient) can be calculated as shown in the following equation, where $Z_0$ is the characteristic impedance.

$$\Gamma = \left| \frac{Z_{in} - Z_0}{Z_{in} + Z_0} \right|$$

The position with the lowest gamma Γ value will give the best match and is stored in the match position table for each load impedance.

Utilizing the parameter and match position tables allows for the matching network to measure the input impedance, calculate the load impedance, and find the best match position extremely quickly. The amount of memory required to store the tables, however, can become quite large depending on the number of tune positions in the parameter table, and the number of load impedances in the match position table. This large amount of data may require additional onboard memory to be added, increasing cost, complexity, and space.

Using One-Dimensional Arrays to Reduce Memory Requirements

To address this issue, the parameter table can be altered. In the embodiment discussed above, the parameter table stores the two-port data of the matching network for each possible combination of the EVCs. If the variable elements can be separated, the lookup table can go from one multi-dimensional array to multiple one-dimensional arrays. This new approach can have a significant reduction in the memory requirements. For example, if two variable elements each have one thousand positions, the table would have one million points, versus two thousand for two one-dimensional arrays. Continuing this example, if a third variable element is added, that also has one thousand positions, the three-dimensional array would have one billion points. This would most likely exceed any practical memory on a DSP. This could also be separated into three different one-dimensional arrays of only three thousand points. This could be expanded further if necessary.

Figure 9:
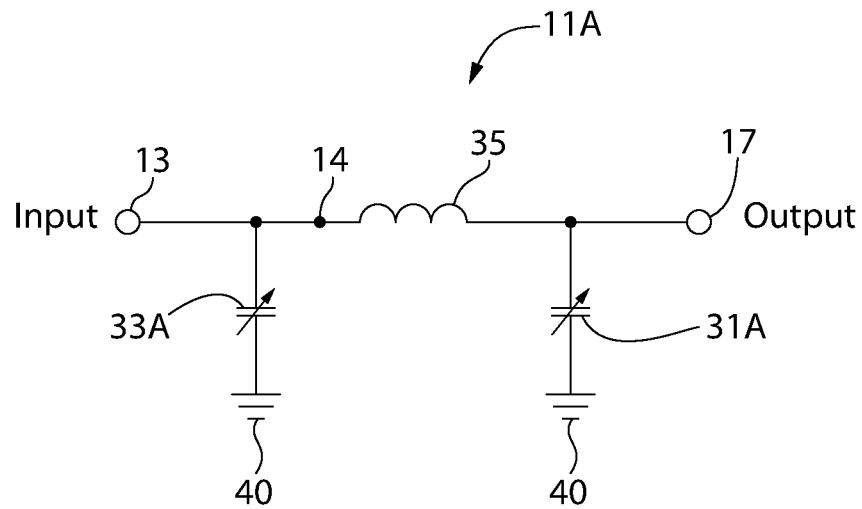
FIG. 9 is a simplified schematic of the pi matching network of FIG. 3.

According to this embodiment using one-dimensional arrays, the system generates a set of two-port parameters for each section of the matching network containing a variable element (e.g., a variable capacitor such as an EVC). In the exemplified embodiment, the matching network is a pi matching network, such as matching network 11A shown in FIG. 3. FIG. 9 is a simplified schematic of the pi matching network 11A of FIG. 3. Note that this is only one example and any variety of matching networks (e.g., L or T) can be used, with two or more variable elements. The shunt capacitors 33A, 31A are the variable elements in this example.

Figure 8C:
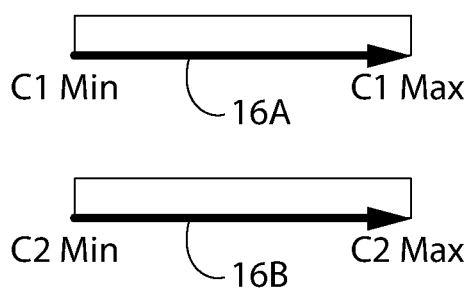
FIG. 8C shows two one-dimensional parameter arrays according to one embodiment.
Figures 10A, 10B:
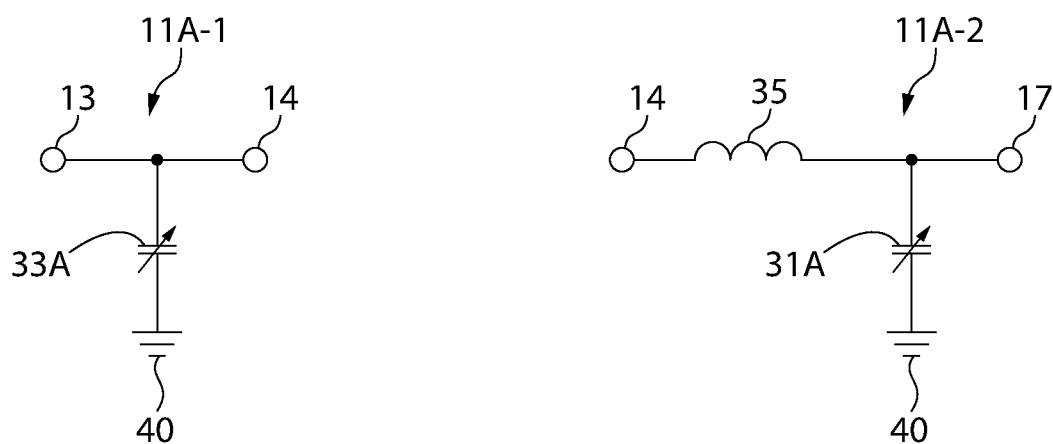
FIGS. 10A-B are first and second portions of the matching network of FIG. 9.

As shown in FIG. 10A and FIG. 10B, the matching network 11A may be divided into two portions, a first portion 11A-1 and a second portion 11A-2. Shared midpoint node 14 is the output for the first portion 11A-1 and the input for the second portion 11A-2. By splitting the matching network accordingly, it has two one-dimensional arrays 16A, 16B, as shown in FIG. 8C, rather than the multi-dimensional array of the parameter table 16 of FIG. 8A.

A challenge is that the load impedance is calculated from the second one-dimensional array corresponding with the second portion 11A-2 and its input (midpoint node 14). The first one-dimensional array corresponding with the first portion 11A-1 can only calculate the load impedance at the midpoint node 14. This can be seen in the following equations, where Z-Parameters are used as in the previous examples. These equations calculated the load impedance for the first one-dimensional array and the second one-dimensional array, respectively.

$$Z_{Load} = \frac{Z[C2]_{21}Z[C2]_{12}}{Z[C2]_{11} - Z[C2]_{in}} - Z[C2]_{22}$$

$$Z[C1]_{Load} = \frac{Z[C1]_{21}Z[C1]_{12}}{Z[C1]_{11} - Z_{in}} - Z[C1]_{22}$$

It is well known that different types of two-port parameters can be combined to form new two-port parameters. To do this with Z-Parameters with a cascaded connection, one set of parameters can be substituted into another. Because the load impedance of the first set of parameters is calculated at the input of the second set of parameters (midpoint node 14), they are equal, as shown in the following equation.

$$Z[C2]_{in} = Z[C1]_{Load} = \frac{Z[C1]_{21}Z[C1]_{12}}{Z[C1]_{11} - Z_{in}} - Z[C1]_{22}$$

The following equation is the final equation, where $Z[C1]_{Load}$ is substituted into $Z[C2]_{in}$.

$$Z_{Load} = \frac{Z[C2]_{21}Z[C2]_{12}}{Z[C2]_{11} + Z[C2]_{22} - \frac{Z[C1]_{21}Z[C1]_{12}}{Z[C1]_{11} - Z_{in}}} - Z[C2]_{22}$$

There are different methods to collect the required data from the matching network. For example, in one method each section of the matching network is measured individually. A second method is to measure one individual section from the end to some midsection of the match, and de-embed it from the full matching network to get the remaining section.

A benefit of the first method is that each section is measured individually, as in FIGS. 10A-B, where the first one-dimensional array (for first portion 11A-1) and the second one-dimensional array (for second portion 11A-2) are both measured individually. This will reduce the complexity of processing the measurements to split up the variable elements. A potential issue is that there may be artifacts added to the measurements. These can be from the fixtures attached to different sections of the matching network, such as a wire from a connector, adding inductance and resistance, or from needing to move components to isolate the various sections from each other, which would alter the parasitics or detune components.

The second method still requires a variable element to be measured individually. After the parameters are measured of the first portion 11A-1, the full matching network 11A would then be measured. The measurements would only require the second EVC 31A to change its value, while the first EVC 33A is held at a known value.

In the exemplified embodiment, the next step is to remove the first EVC from the measurements of the full matching network. This is done with de-embedding. This is typically done with test fixtures, but the concept will work with this application as well. In this embodiment, T-Parameters are used for de-embedding, though the invention is not so limited. For example, other parameters such as ABCD can be used.

The full matching network is made of two sections of T-parameters, as shown in the following equation.

$$[T_{Match}] = [T_{Params\ 1}][T_{Params\ 2}]$$

This embodiment assumes the first port is at the input 13 of the matching network and the second port is at the output 17 of the matching network. $T_{Params\ 1}$ must be divided out from the input to remove them from $T_{Match}$. To do that, $T_{Params\ 1}$'s matrix must be inverted and then multiplied to the input of the match, as in the following equation.

$$[T_{Params\ 2}] = [T_{Params\ 1}]^{-1}[T_{Match}] = [T_{Params\ 1}]^{-1}[T_{Params\ 1}][T_{Params\ 2}]$$

If a third element is added, it will be removed from the output, as seen in the following equations.

$$[T_{Match}] = [T_{Params\ 1}][T_{Params\ 2}][T_{Params\ 3}]$$

$$[T_{Params\ 2}] = [T_{Params\ 1}]^{-1}[T_{Match}][T_{Params\ 3}]$$

Now that there is a way to collect the parameters and calculate the load impedance, the match position table can now be calculated. It will be done slightly differently than the original method. Instead of using the earlier equation for calculating input impedance $Z_{in}$ with each predefined load, the following equation is utilized. That result is then fed into earlier equation for calculating Gamma Γ. This will then be repeated for all the predefined loads as in the original match position table.

$$Z_{in} = Z[C1]_{11} - \frac{Z[C1]_{21}Z[C1]_{12}}{Z[C1]_{22} + Z[C2]_{11} - \frac{Z[C2]_{21}Z[C2]_{12}}{Z[C2]_{22} + Z_{Load}}}$$

Note that, if flash memory is short, but there is enough RAM to hold the two-dimensional parameter table, it is possible to recalculate the table from the two one-dimensional tables using the previously stated methods. This would reduce the calculation time, because the number of variables is reduced. Calculations in T-parameters, or ABCD, could be used for simplicity. Then the values can be converted to other convenient parameters, such as Z.

Figure 10C:
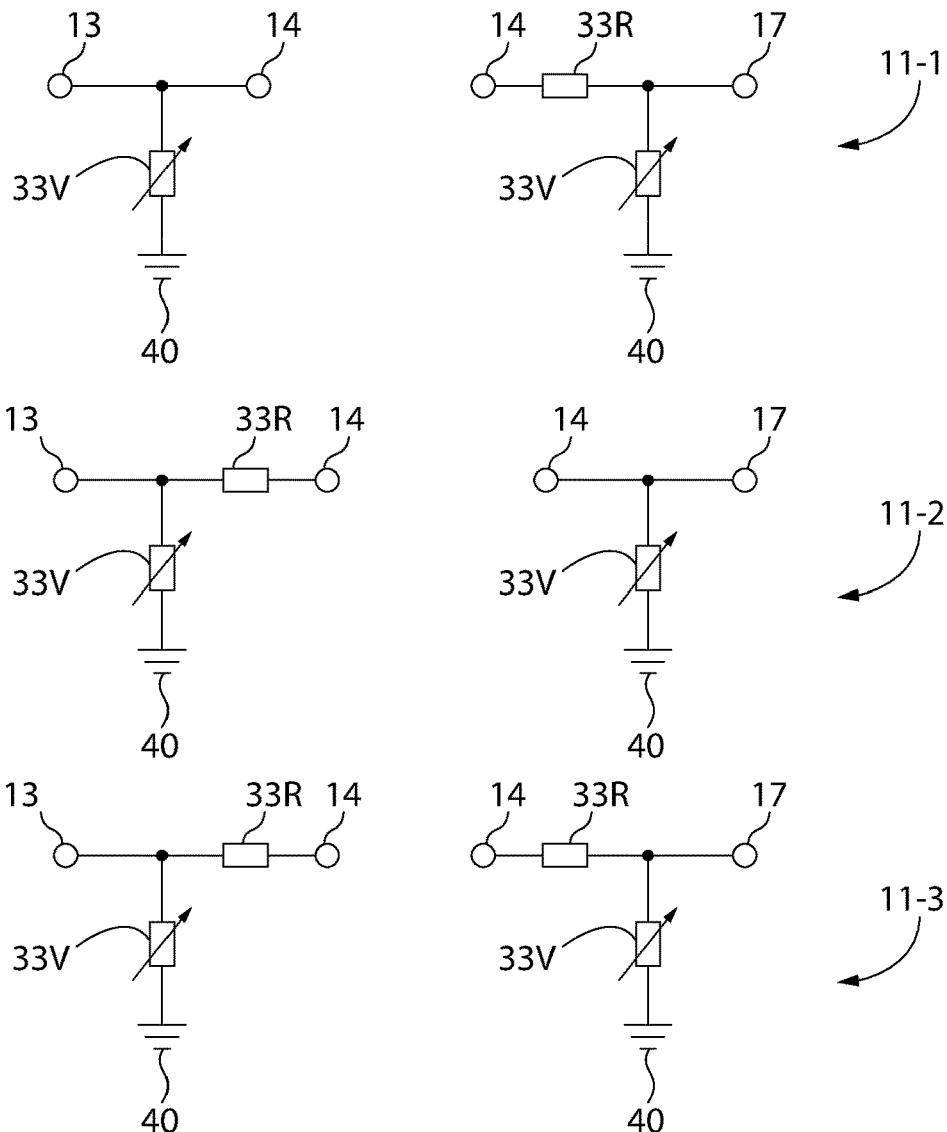
FIGS. 10C-F are various matching networks being divided into first and second portions.

While FIGS. 10A-10B show one example of how a matching network may be divided into two portions, the invention is not limited to this embodiment. FIGS. 10C-10F show a variety of matching networks and methods of dividing those matching networks into two portions, and the invention is not limited to these. FIG. 10C shows a variety of ways to separate a pi matching network. Matching network 11-1 is similar to that shown in FIGS. 9-10B. The difference is that in FIG. 10C the variable reactance elements 33V are not limited to variable capacitors, and the reactance element 33R is not limited to an inductor. Rather, in FIG. 10C-10F each reactance element 33V, 33R (variable or fixed) can include any one or more discrete reactance elements (e.g., capacitors and inductors) in series or in parallel, or a network of same.

The second pi matching network 11-2 moves the reactance element 33R to the other side of the midpoint node 14. The third pi matching network 11-3 splits the reactance element 33R. For example, if the reactance element 33R was an inductor and capacitor in series, the capacitor could be in the first portion of the matching network and the inductor in the second portion.

Figure 10D:
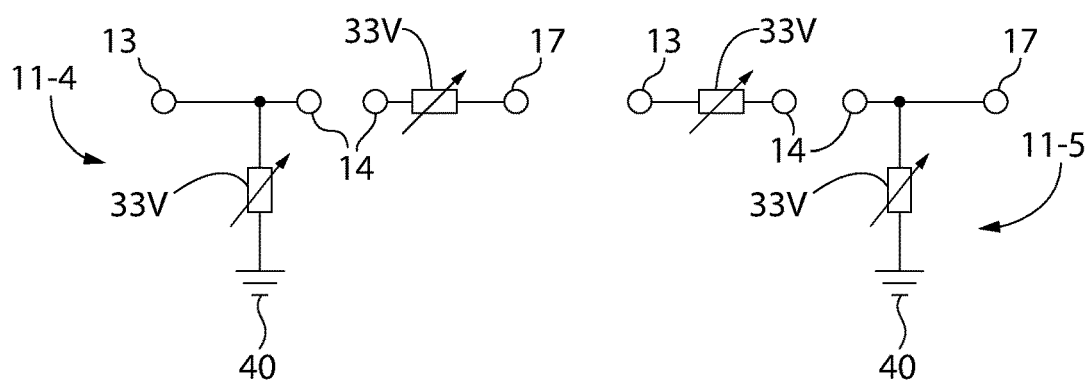
Figure 10E:
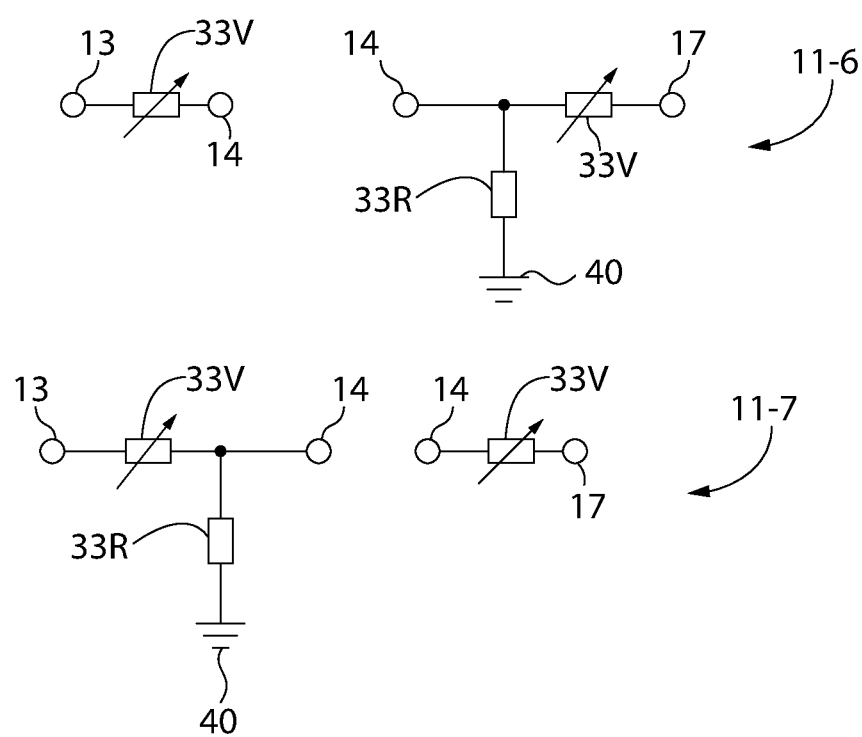
Figure 10F:
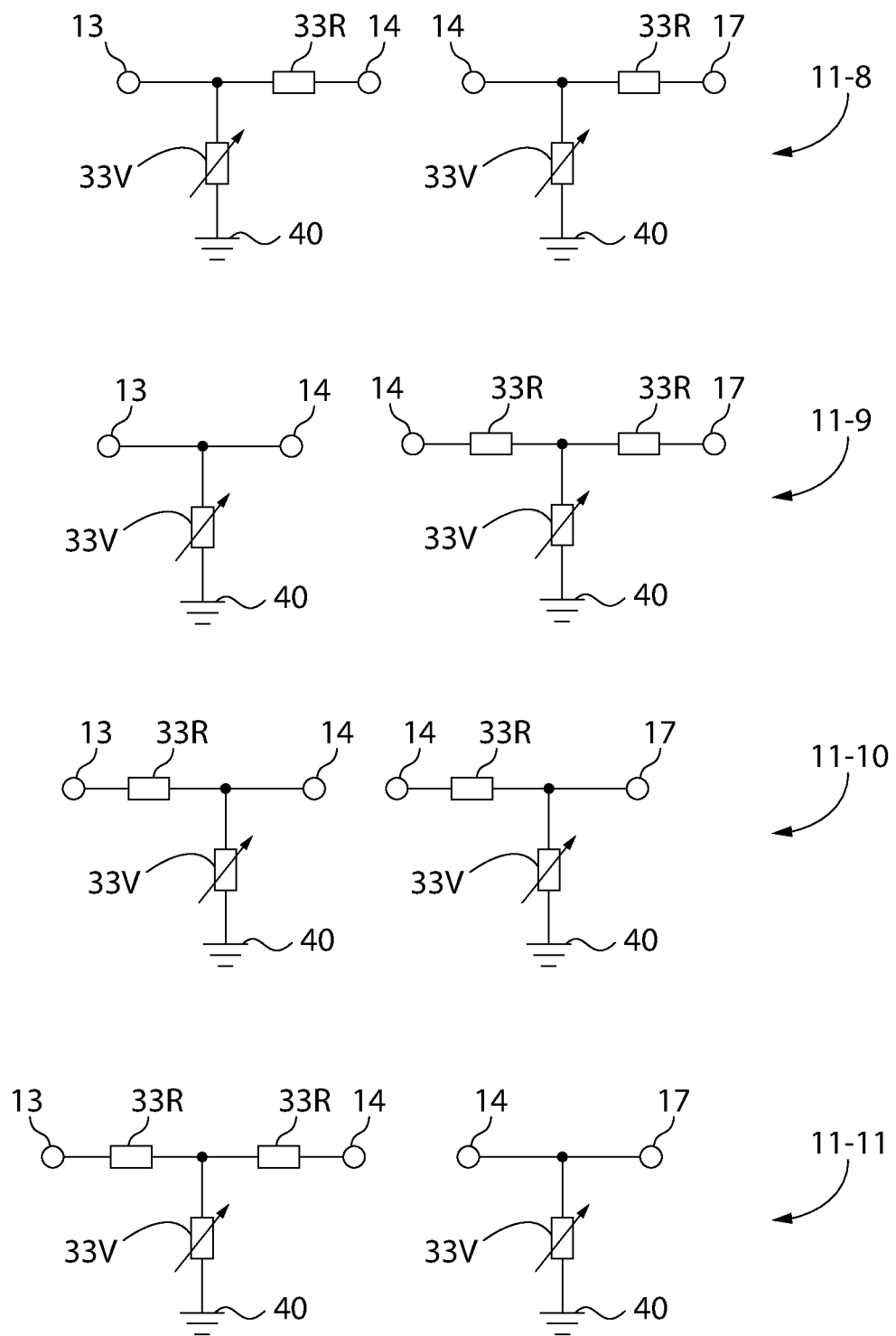

FIG. 10D shows a variety of ways to divide an L-matching network into two portions. Matching network 11-4 has a series variable reactance element 33V coupled to the output 17, while matching network 11-5 has a series variable reactance element 33V coupled to the input 13. Each are isolated from a shunt variable reactance element 33V. FIG. 10E shows a variety of ways to divide a T-matching network into two portions. Matching network 11-6 has reactance element 33R in the second portion, while matching network 11-7 has reactance element 33R in the first portion. FIG. 10F shows a variety of ways to divide a double L-matching network into two portions. As can be seen, for the different matching networks 11-8 to 11-11, the reactance elements 33R can be placed in a variety of positions with respect to the first and second portions.

Figure 11:
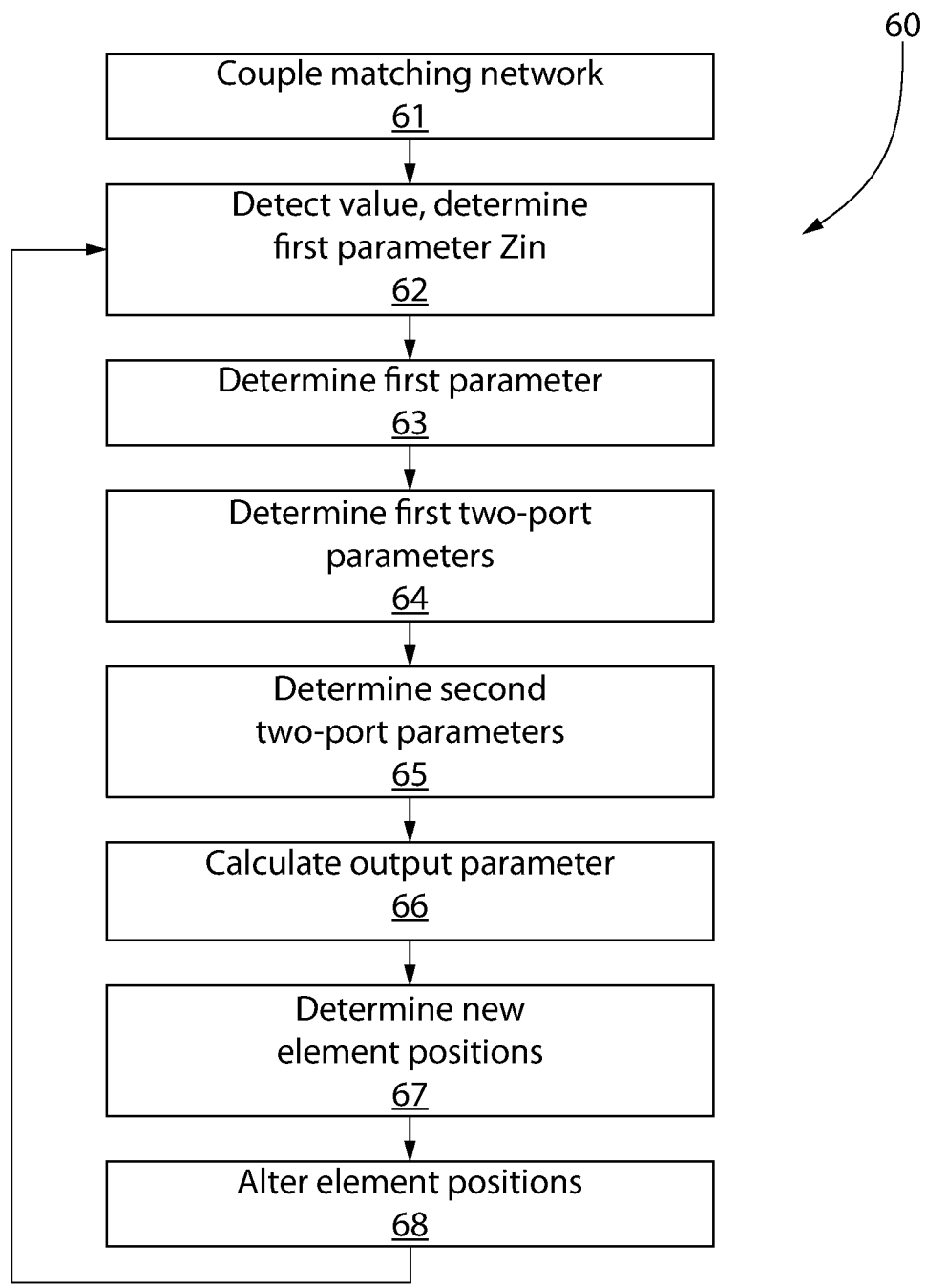
FIG. 11 is a flow chart of a method of matching an impedance according to one embodiment using multiple single-dimension arrays to reduce the size of the parameter table.

FIG. 11 is a flowchart of a method 60 of matching an impedance according to one embodiment. In this embodiment, a matching network is coupled between an RF source and a plasma chamber (operation 61), as in FIGS. 1-3. The matching network has (1) a first variable reactance element configured to provide a variable first reactance element position, the first reactance element position controlling the total reactance provided by the first variable reactance element, and (b) a second variable reactance element configured to provide a variable second reactance element position, the second reactance element position controlling the total reactance provided by the second variable reactance element. These variable reactance elements may be, for example, a capacitor or an inductor. In one embodiment, one or more of the variable reactance elements are EVCs, each EVC comprising discrete capacitors configured to switch in and out to enable the EVC to provide the variable first reactance element position or the variable second reactance element position, and thereby alter the total capacitance of the respective EVCs. It is noted that the invention is not limited to the use of two variable reactance elements and may include more than two variable reactance elements.

The exemplified method next detects, by a sensor (e.g., sensor 21 of FIGS. 2-3) a value (e.g., a voltage or voltages, a current, and/or a phase at the RF input) related to the plasma chamber or the matching network (operation 62). Based on this detected value, the method determines a first parameter (operation 63). In the exemplified embodiments, the first parameter is an input impedance at the RF input of the matching network based on the detected value, though the invention is not so limited, as it may be any parameter related to the matching network. Methods for determining the input impedance are discussed above.

The exemplified method next determines first two-port parameters (e.g., Z or S) from a first one-dimensional array that corresponds to a first portion of the matching network using the first reactance element position (operation 64), and determines second two-port parameters from a second one-dimensional array that corresponds to a second portion of the matching network using the second reactance element position (operation 65), the second portion of the matching network being distinct from the first portion. Methods for determining these two-port parameters are discussed above. In a preferred embodiment, each one-dimensional array comprises, for each potential reactance element position, corresponding two-port parameters.

The exemplified method next calculates an output parameter of the RF output based on the first parameter, the first two-port parameters, and the second two-port parameters (operation 66). The output parameter may be any parameter related to the plasma chamber or matching network RF output. In a preferred embodiment, the output parameter is a load impedance, as discussed above.

The exemplified method next determines a new first reactance element position and a new second reactance element position from a match position table (sometimes referred to as the match position table) using the calculated output parameter (e.g., load impedance) (operation 67). In a preferred embodiment, the match position table comprises, for each of a plurality of output parameters (e.g., load impedances), corresponding new first and second reactance element positions that would cause a desired input parameter at the RF input. Further, in a preferred embodiment, the determination of the new first and second reactance element positions that would cause the desired input parameter is carried out by either (a) calculating an input impedance at the RF input for each of the plurality of output parameters (e.g., load impedances) using the two-port parameters; or (b) calculating a reflection value for each calculated input impedance, the desired input parameter being the lowest reflection value. The reflection value may be, for example, a reflection coefficient (referred to herein as gamma) at the RF input of the matching network.

Once the new element positions are determined, the exemplified method next alters the first variable reactance element to the new first reactance element position, and altering the second variable reactance element to the new second reactance element position to reduce a reflected power (operation 68). Operations 62-68 can then be repeated as necessary to adjust to changing conditions in the plasma chamber or elsewhere. It is noted that these operations may be carried out by a control circuit such as control circuit 45 of FIGS. 2 and 3.

It is noted that the invention is not limited to the above method for determining a load impedance based on an input impedance. For example, in another embodiment, one could use a dual directional coupler on the input of the match, measure the forward and reflected voltage waves, and the phase angle between them. This would give allow determination of the complex gamma. That could be used inherently with T-parameters to de-embed the match and find the gamma of the load. The system could then use a capacitor (or other reactive element) lookup table that uses the load gamma instead of $Z_{load}$. One could also use the coupler to calculate the input impedance, and then use Z-parameters, or some other parameters.

It is further noted that the matching networks described herein may form part of a semiconductor processing tool, such as tool 12 of FIG. 1. Further, the exemplified methods of impedance matching may form part of a method of manufacturing a semiconductor, the method including placing a substrate in a plasma chamber configured to deposit a material layer onto the substrate or etch a material layer from the substrate.

The foregoing disclosure provides advantageous methods for reducing the size of the parameter table by dividing the matching network into different portions for each variable element. This method will reduce the amount of memory. It may require extra calculation steps, but will have no adverse effects on the matching network's tuning accuracy.

Simulated Error-Based Tuning

As discussed above, utilizing parameter and match position tables allows for the matching network to measure the input impedance, calculate the load impedance, and find the best match position extremely quickly. The amount of memory required to store the tables, however, can become quite large depending on the number of tune positions in the parameter table, and the number of predefined load impedances in the match position table. One way to reduce the memory requirements is to reduce the number of points in the match position table. But this may cause the matching network to not meet the desired reflection coefficient (gamma) or voltage standing wave ratio (VSWR). It is also possible to remove the match position table altogether, but if one calculated every tuning position, this approach would take an excessive amount of time.

But a matching network can find the best tune position without calculating every point. In a traditional error-based method, a matching network would use the phase and magnitude errors to find the best tune position. The matching network would vary one of its variable elements, knowing whether it affected the phase or magnitude error, and bring that error to a minimum by monitoring the changes in error as the variable element was changed. Then, the unit would vary another element to reduce the other error to a minimum. These steps would be repeated until both the phase and magnitude errors were brought to a minimum. But such a traditional error-based method is slow to arrive at a match position.

The method discussed below is an improvement to the error-based method. Rather than changing the variable capacitors' positions and determining the change in error (e.g., reflected power), the disclose method uses calculations to simulate changes in the variable capacitors' positions and the resulting error to determine the best capacitor positions, and only after making these calculations changes the actual variable capacitors. It is noted that, while the invention is described in the context of using a variable capacitor such as an EVC, the disclosed method can apply to a system using any variable reactance element, including any variable capacitor (such as any mechanically variable capacitor (including a VVC)) and any variable inductor. It is further noted that, while the exemplified embodiment discusses use of two variable reactance elements, additional variable reactance elements may be utilized.

In the exemplified embodiment, the system using a detected value to determine an input impedance $Z_{in}$, and determines a load impedance (a type of system parameter) from the input impedance and a two-port parameter table. The invention, however, is not so limited. Other values related to the plasma chamber and/or matching network can be detected, and other system parameters (that is, parameters related to the system) can be determined based on the detected value. As will be explained below, at a highest level, the invention can be understood as calculating an error-related value (such as a phase error or a magnitude error) for each of a plurality of potential first reactance element positions or for each of a plurality of potential second reactance element positions; calculating a new first reactance element position and a new second reactance element position based on the error-related values calculated in the prior step; and altering the first reactance element to the new first reactance element position, and altering the second reactance element to the new second reactance element position to reduce a reflected power.

Since in the exemplified embodiment the load impedance is calculated from input impedance $Z_{in}$ and the parameter table (see, e.g., FIG. 8A), it is possible to calculate what $Z_{in}$ would be if the variable capacitors were at other positions with the same load impedance, using the following equation, during runtime.

$$Z_{in} = Z_{11} - \frac{Z_{21}Z_{12}}{Z_{22} + Z_{Load}}$$

$Z_{in}$ can be used to calculate the phase and magnitude errors. With this, the matching network can calculate the best tune position before making any adjustments to its variable capacitors.

The phase error can be calculated using the resistance, R, and the reactance, X, of $Z_{in}$. The error can be calculated using the following. Assuming 0Ω of reactance is required, a phase angle of 0° is equivalent to 0% error, and ±90° would give the maximum error of 100%.

$$Error_\theta = \left| \frac{2\tan^{-1}\left(\frac{X_{in}}{R_{in}}\right)}{\pi} \right| * 100\%$$

The magnitude error can be found with the input admittance, which is equivalent to the reciprocal of the input impedance, as in the following equation.

$$Y_{in} = G_{in} + jB_{in} = \frac{1}{Z_{in}} = \frac{1}{R_{in} + jX_{in}}$$

Only the conductance, $G_{in}$, is necessary for calculating the error, see the following equation.

$$Error_{magnitude} = |\log_2(G_{in} * Z_0)| * 100\%$$

A conductance of 0.02Ω$^{-1}$ gives an error of 0%, where $Z_0$, the characteristic impedance, is equal to 50Ω. There is no maximum error as conductance can vary from 0 to infinity, but 100% would be equal to half or double the desired conductance, 0.01Ω$^{-1}$ and 0.04Ω$^{-1}$ in a 50Ω system.

It is also possible to change the required input impedance. For example, if it needs to be 100+j0 to be considered matched, the phase error will be unchanged, but the magnitude error will be 0% when $G_{in}$ is equal to 0.01Ω$^{-1}$. Another example would be if a complex input impedance is required, such as 50+j50Ω. This gives a minimum error for $G_{in}$ at 0.01Ω$^{-1}$, but now the phase angle is considered 0% at 45°. To calculate the phase error, the following equation may be used, where $R_{Desired}$ and $X_{Desired}$ are the desired input impedance.

$$Error_\theta = \left| \frac{2\tan^{-1}\left(\frac{X_{in}}{R_{in}} - \frac{X_{Desired}}{R_{Desired}}\right)}{\pi} \right| * 100\%$$

Figure 12:
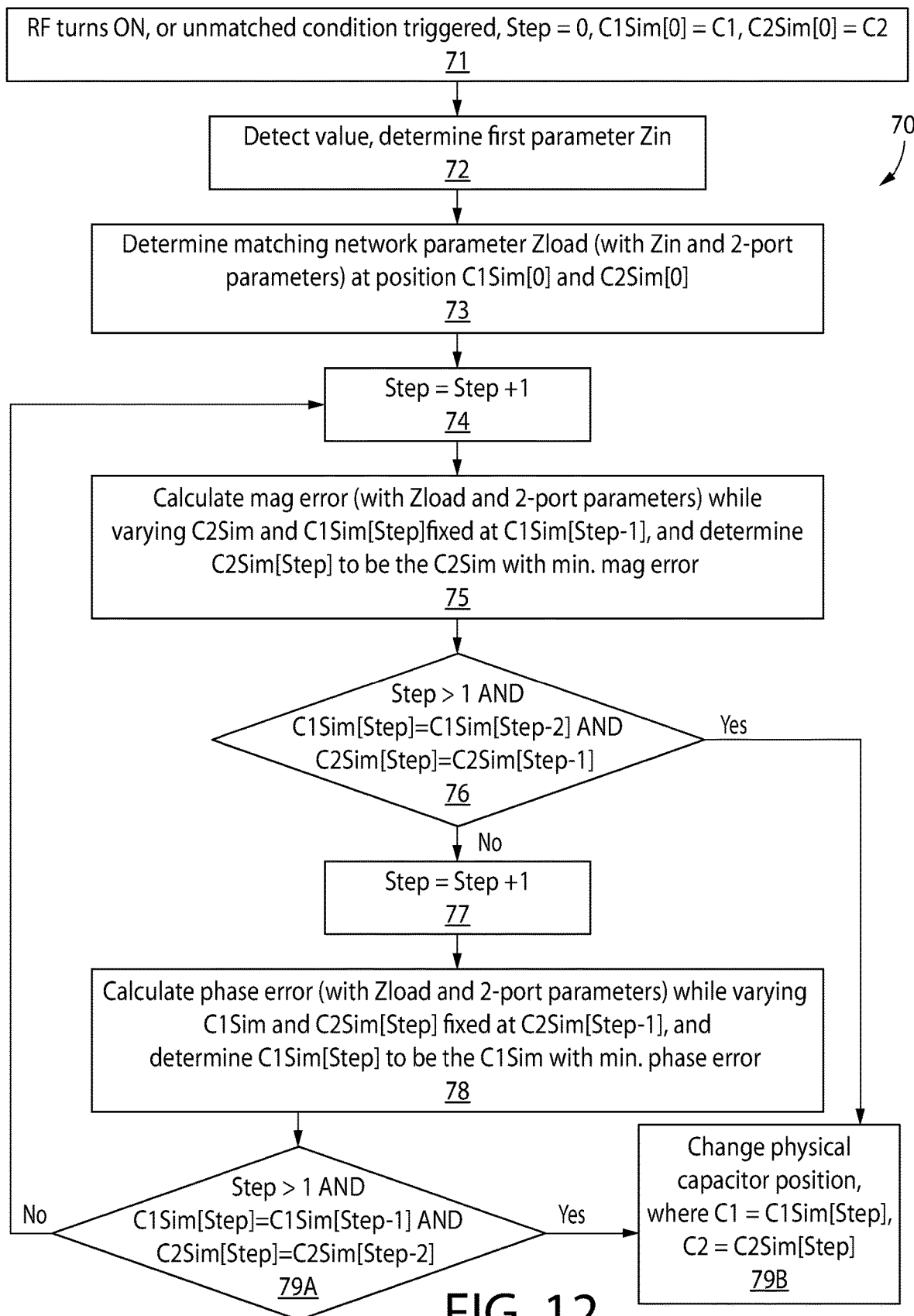
FIG. 12 is a flow chart of a simulated error-based method of matching an impedance according to one.

FIG. 12 is a flow chart of a method 70 of matching an impedance with simulated error-based tuning using the above equations (or comparable equations). In a first step (step 71), the RF signal from the RF source (see, e.g., FIGS. 1-3) turns on, or an unmatched condition is triggered. At this time, the system is at Step 0, and first capacitor (C1) is at simulated position 0 (C1Sim[0]) and the second capacitor (C2) is at simulated position 0 (C2Sim[0]).

In the following example, C1 is variable capacitor 33A of the first shunt of the matching network 11A in FIG. 9, and C2 is variable capacitor 31A of the second shunt of the matching network 11A in FIG. 9. In this instance, capacitor C1 of the first shunt has a greater impact on the magnitude error, while C2 of the second shunt has a greater impact on the phase error. It is noted that the methods described herein are not limited to pi matching networks. For example, in an L-matching network such as in FIG. 2, the shunt capacitor 33 will have greater impact on the magnitude error, while the series capacitor 31 will have greater impact on the phase error.

A sensor detects a value (e.g., a voltage, a current, or a phase) and, based thereon, determines the input impedance $Z_{in}$ (step 72). The system then determines matching network parameter $Z_{load}$ based on $Z_{in}$ and the two-port parameter table for positions C1Sim[0] (the current position of capacitor C1) and C2Sim[0] (the current position of capacitor C2). As discussed above, the invention is not limited to the determination of the above parameters. For example, the system parameter is not limited to the load impedance, but may be another parameter related to the system. Further, the system parameter may be determined using a value other than the RF input. In one embodiment, for example, the system parameter is the output impedance measured directly at the output of the matching network.

In step 74, the tuning step is increased by 1. For example, if the RF source has just turned on, or an unmatched condition is triggered, the step number would be increased from 0 to 1.

In step 75, the system calculates the magnitude error (using $Z_{load}$ and two-port parameters) where C1 is fixed at its value from the prior step (C1Sim[Step−1]) and C2 is varied. Using these calculations, the system determines a new simulated C2 value (C2Sim[Step]) that has the minimum magnitude error. The invention, however, is not limited to this embodiment. The system may, for any determined system parameter and a current actual first reactance element position, calculate a magnitude error for each of the plurality of potential second reactance element positions to calculate the new second reactance element position, the new second reactance element position providing a lowest calculated magnitude error.

In step 76, it is determined whether (1) the step number is greater than 1, (2) the currently-calculated C1 position (C1Sim[Step]) is the same as the previously-calculated C1 position (C1Sim[Step−2]) and (3) the currently-calculated C2 position (C2Sim[Step]) is the same as the previously-calculated C2 position (C2Sim[Step−1]). If so, according to step 79B, the capacitors physically change to these new capacitor positions.

Note that determining whether the capacitor position have stopped changing in the simulations/calculations is not the only method for determining whether to carry out the physical change. For example, the actual change to the capacitor positions can be triggered when the lowest calculated magnitude error is below a predetermined magnitude error value, and the lowest calculated phase error is below a predetermined phase error value. Further, the actual change to the capacitor positions can be triggered when a calculated reflection value (e.g., gamma) is below a predetermined reflection value.

In step 77, the step is increased by 1 again. For example, if the RF source had recently turned on, the tuning step number increased from 0 to 1 at step 74 and increased from 1 to 2 in step 77.

In step 78, the system calculates the phase error (using $Z_{load}$ and two-port parameters) where C2 is fixed at its value from the prior step (C2Sim[Step−1]) and C1 is varied. Using these calculations, the system determines a new simulated C1 value (C1Sim[Step]) that has a minimum phase error. The invention, however, is not limited to this embodiment. The system may, for any determined system parameter and the new second reactance element position (from step 75), calculate a phase error for each of the plurality of potential first reactance element positions to calculate the new first reactance element position, the new first reactance element position providing a lowest calculated phase error.

In step 79, a similar determination is carried out as to previous step 76, namely, whether the calculated capacitor positions have remained the same. If they have (if they have not changed), the capacitors are physically altered to the newly calculated capacitor positions (step 78B). If the capacitor positions have changed, the system returns to step 74, and the steps of 74-79A repeat (with the step values increasing and the calculated new capacitor positions changing) until at step 76 or 79A the calculated capacitor positions stop changing. It is noted that, as with step 76, step 79A is not limited to monitoring whether the calculated capacitor positions have changed, and can alternatively monitor whether values such as error values or reflection values are below a predetermined threshold.

It is noted that steps 75 and 76 discussed above may be swapped with steps 78 and 79A. It is not necessary to calculate magnitude error or phase error first, or to calculate a new C1 or C2 value first. It is possible to determine which error has a higher magnitude at the beginning of tuning and use that to determine which capacitor is varied first.

The following table provides an example of the steps carried out by the system according to one embodiment of simulated error-based tuning.

| Step | C1 | C2 | Step |
|---|---|---|---|
| 0 | 0, 0 (0%) | 0, 0 (0%) | Determine load impedance |
| 1 | 0, 0 (0%) | 5, 4 (25.1%) | Find best Mag Error by calculating C2, but C1 fixed at 0, 0 |
| 2 | 9, 10 (45.9%) | 5, 4 (25.1%) | Find best Phase Error by calculating C1, but C2 fixed at 5, 4 |
| 3 | 9, 10 (45.9%) | 14, 0 (66.9%) | Find best Mag Error by calculating C2, but C1 fixed at 9, 10 |
| 4 | 7, 5 (34.9%) | 14, 0 (66.9%) | Find best Phase Error by calculating C1, but C2 fixed at 14, 0 |
| 5 | 7, 5 (34.9%) | 14, 15 (71.3%) | Find best Mag Error by calculating C2, but C1 fixed at 7, 5 |
| 6 | 7, 6 (35.2%) | 14, 15 (71.3%) | Find best Phase Error by calculating C1, but C2 fixed at 14, 15 |
| 7 | 7, 6 (35.2%) | 15, 3 (72.5%) | Find best Mag Error by calculating C2, but C1 fixed at 7, 6 |
| 8 | 7, 6 (35.2%) | 15, 3 (72.5%) | Find best Phase Error by calculating C1, but C2 fixed at 15, 13 No change in position from 7 to 8. Stop calculating and change physical position to 7, 6; 15, 3, (35.2%; 72.5%) |

For each capacitor, the initial numbers represent the number of coarse and fine capacitors switched in. For example, in step 2, 9 coarse capacitors are switched in and 10 fine capacitors are switched in. The percentage represents the percentage of capacitance switched in, where 0% is where all the discrete capacitors are off and the therefore the variable capacitor has its minimum capacitance, 100% is where all the discrete capacitors are on and therefore the variable capacitor has the maximum capacitance, and 50% is where the variable capacitor provides a capacitance halfway between 0% and 100%. At step 0, none of the capacitors are switched in, and the load impedance is determined, though the invention is not so limited, as any number of capacitors may be switch in at the beginning of the tuning process. In step 1, C1 is fixed while the best C2 position for magnitude error is calculated. In step 2, C2 is fixed at the newly calculated position while the best C1 position for phase error is calculated. This back-and-forth calculation of new C2 and C1 values is continued in steps 3-8 until it is determined at step 8 that there has been no change in position from step 7 to step 8. At this point, the actual physical positions of C1 and C2 are changed to the newly calculated positions. As discussed above, in other embodiments the calculations may end (and the physical change be caused) based on other values such as an error value or reflection value being below a predetermined value.

Tests were run to verify that the method worked as expected. A matching network's S-Map was taken. The match position tables were calculated to find the best match position, where $Z_{in}$ is equal to 50+j0Ω, for every point. Random points were selected to compare this new method to the original method for accuracy. A load impedance point that is matched near the maximum position of both reactive elements of the match, starting at the minimum value of each element, was selected to show a worst-case scenario. As shown in U.S. Provisional Patent Application No. 62/850, 589, which is incorporated herein by reference in its entirety, Smith Chart plots to give a visual representation of the matching.

The first trial computed at all the points for each round. There is a total of 2016 points that were calculated. If the error of the current position is compared to the previous position, the direction toward the minimum error can be determined, reducing the total number of points calculated. With determining the direction of the lowest error, it required 501 calculations. The original method takes 56,784 steps for each load impedance. This gave a 99.12% decrease in the number of calculations for this load impedance.

Although the above, simulated error-based search method took far fewer steps, the match position lookup table method is still faster. The number of calculations could be reduced further by using a modified version of a binary search. Other search algorithms exist, but binary search should take the least number of steps for the number of positions in each step.

To implement this algorithm, there will be three objects, left, middle, and right to store position and error, and a variable for step size. The center position's error is calculated first and set to the middle. Then the step size is set for halfway from the center to the end positions. Their errors are calculated and the three are compared. The position with the lowest error is now set to the middle, and step size is then cut in half. This is repeated, until the step size is less than one.

Assuming for a worst case that the search takes $O(2 \log_2 n)$, which will be rounded up each round, the eight rounds of searches were performed, and the full length was searched each round, the total number of calculations would be 128. This reduces the original number of calculations needed by about 99.79%.

After the first two or four rounds of searching, the gamma is very low. The search could stop when the gamma is below a certain threshold, which would reduce the number of rounds of searching. Since, the gamma is lower each round or pair of rounds, the search area can also be shrunken. The number of calculations can be decreased by reducing the starting steps size for each successive round.

Another method to reduce the time would be to use a tune table with a very coarse step size, and then search for the best tune position in a very small area. For example, if the load impedance is within four known points, it would only need to look within that range of points. This would significantly reduce the size of the search area, speeding up the tune time while only requiring a relatively small match position table.

There is also a way to do an x/y error on the Smith Chart. Magnitude error is historically calculated with magnitude of voltage divided by the magnitude of current at the input, which is the absolute value of $Z_{in}$. The magnitude on the real axis of the chart is then calculated with, $(|Z_{in}|-50\Omega)/(|Z_{in}|+50\Omega)$. This is equivalent to the real part of gamma. The absolute value of this would be used as the absolute error.

Figure 13:
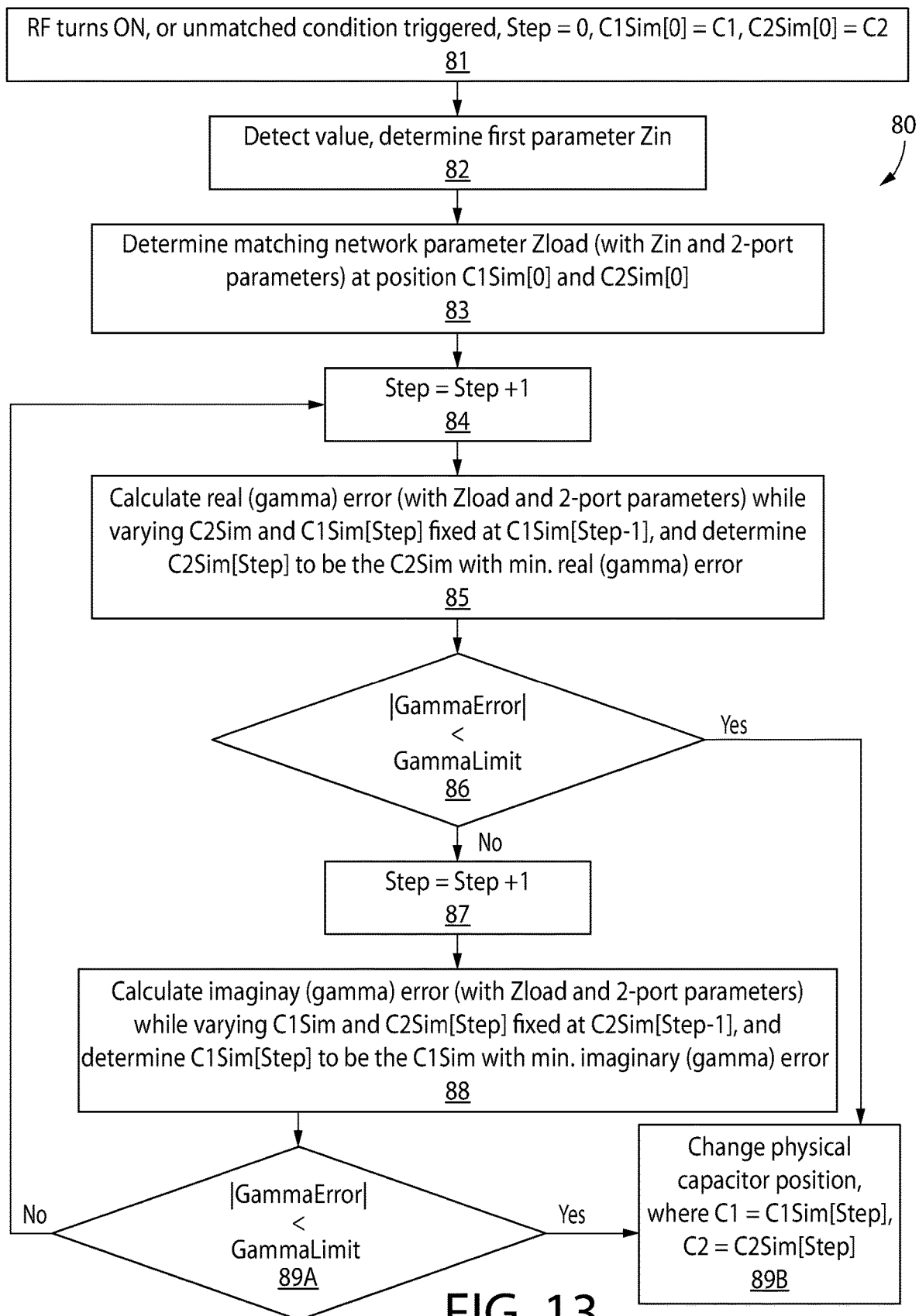
FIG. 13 is a flow chart of an alternative simulated error-based method of matching an impedance according to another embodiment.

Finally, as an alternative embodiment, a reflection value such as gamma (the voltage reflection coefficient) may be used for tuning. The real part of gamma can give you left and right, which could be used for the magnitude. One could also look at the imaginary part of gamma, and substitute that for the phase error. FIG. 13 is a flow chart of such a method 80 of simulated error-based tuning. Steps 81-84, 87, and 89B correspond with steps 71-74, 77, and 79B of FIG. 12.

In step 85, the system calculates the real gamma error with C1 fixed and C2 varied to determine the new C2 value. In step 86, it is determined whether the gamma error is below a predetermined gamma limit. In step 88, the system calculates the imaginary gamma error (rather than the phase error) with C2 fixed and C1 varied to determine the new C1 value. In step 88, it is determined again whether the gamma error is below a predetermined gamma limit. Otherwise, the method 80 may behave similarly to the method 70 described above with respect to FIG. 12. It is also possible to use different combination of error calculations. One example would be to use the real part of gamma, and the phase error.

It is noted that matching networks carrying out the above-described methods (such as those matching networks described herein) may form part of a semiconductor processing tool, such as tool 12 of FIG. 1. Further, the exemplified methods of impedance matching may form part of a method of manufacturing a semiconductor, the method including placing a substrate in a plasma chamber configured to deposit a material layer onto the substrate or etch a material layer from the substrate.

New methods for tuning a variable matching network have been described. These methods, which calculates the best tune position using the 2-port network parameters of the matching network, allow for a significant reduction, or even the removal of, the tune table. It is also possible to use more advanced search algorithms to cut this time down even further.

While the embodiments of a matching network discussed herein have used L or pi configurations, it is noted that he claimed matching network may be configured in other matching network configurations, such as a 'T' type configuration. Unless stated otherwise, the variable capacitors, switching circuits, and methods discussed herein may be used with any configuration appropriate for an RF impedance matching network.

While the embodiments discussed herein use one or more variable capacitors in a matching network to achieve an impedance match, it is noted that any variable reactance element can be used. A variable reactance element can include one or more discrete reactance elements, where a reactance element is a capacitor or inductor or similar reactive device.

While the inventions have been described with respect to specific examples including presently preferred modes of carrying out the invention, those skilled in the art will appreciate that there are numerous variations and permutations of the above described systems and techniques. It is to be understood that other embodiments may be utilized and structural and functional modifications may be made without departing from the scope of the present inventions. Thus, the spirit and scope of the inventions should be construed broadly as set forth in the appended claims. Finally, it is noted that this application incorporates by reference in its entirety U.S. Pub. No. US2018/076788.

What is claimed is:

1. An impedance matching network comprising:
   an RF input configured to operably couple to an RF source;
   an RF output configured to operably couple to a plasma chamber;
   a first reactance element configured to provide a variable first reactance element position, the first reactance element position controlling the total reactance provided by the first reactance element;
   a second reactance element configured to provide a variable second reactance element position, the second reactance element position controlling the total reactance provided by the second reactance element;
   a control circuit configured to carry out a matching process of:
      detecting, by a sensor, a value related to the plasma chamber or the matching network;
      determining a first parameter of the matching network based on the detected value;
      determining first two-port parameters from a first one-dimensional array that corresponds to a first portion of the matching network using the first reactance element position;

determining second two-port parameters from a second one-dimensional array that corresponds to a second portion of the matching network using the second reactance element position, the second portion of the matching network being distinct from the first portion;

calculating an output parameter of the RF output based on the first parameter, the first two-port parameters, and the second two-port parameters;

determining a new first reactance element position and a new second reactance element position from a match position table using the calculated output parameter; and altering the first reactance element to the new first reactance element position, and altering the second reactance element to the new second reactance element position to reduce a reflected power.

2. The matching network of claim 1:
wherein the detected value comprises at least one of a voltage, a current, or a phase at the RF input; and
wherein the first parameter is an input impedance at an RF input of the impedance matching network.

3. The matching network of claim 1 wherein each one-dimensional array comprises, for each potential reactance element position, corresponding two-port parameters.

4. The matching network of claim 1 wherein each of the first reactance element and the second reactance element is a variable capacitor whose total reactance is a total capacitance, or each is a variable inductor whose total reactance is a total inductance.

5. The matching network of claim 1 wherein each of the first reactance element and the second reactance element is an electronically variable capacitor (EVC), each EVC comprising discrete capacitors configured to switch in and out to enable the EVC to provide the variable first reactance element position or the variable second reactance element position.

6. The matching network of claim 1 wherein the match position table comprises, for each of a plurality of output parameters, corresponding new first and second reactance element positions that would cause a desired input parameter at the RF input.

7. The matching network of claim 6 wherein the corresponding new first and second reactance element positions that would cause the desired input parameter is determined by:
calculating an input impedance at the RF input for each of the plurality of output parameters using the two-port parameters; and
calculating a reflection value for each calculated input impedance, the desired input parameter being the lowest reflection value.

8. The matching network of claim 7 wherein the reflection value is a reflection coefficient at the RF input of the matching network.

9. The matching network of claim 1 wherein the matching network comprises more than two variable reactance elements.

10. A semiconductor processing tool comprising:
a plasma chamber configured to deposit a material onto a substrate or etch a material from the substrate; and
an impedance matching network operably coupled to the plasma chamber, the matching network comprising:
an RF input configured to operably couple to an RF source;
an RF output configured to operably couple to the plasma chamber;
a first reactance element configured to provide a variable first reactance element position, the first reactance element position controlling the total reactance provided by the first reactance element;
a second reactance element configured to provide a variable second reactance element position, the second reactance element position controlling the total reactance provided by the second reactance element;
a control circuit configured to carry out a matching process of:
detecting, by a sensor, a value related to the plasma chamber or the matching network;
determining a first parameter of the matching network based on the detected value;
determining first two-port parameters from a first one-dimensional array that corresponds to a first portion of the matching network using the first reactance element position;
determining second two-port parameters from a second one-dimensional array that corresponds to a second portion of the matching network using the second reactance element position, the second portion of the matching network being distinct from the first portion;
calculating an output parameter of the RF output based on the first parameter, the first two-port parameters, and the second two-port parameters;
determining a new first reactance element position and a new second reactance element position from a match position table using the calculated output parameter; and
altering the first reactance element to the new first reactance element position, and altering the second reactance element to the new second reactance element position to reduce a reflected power.

11. A method of matching an impedance, the method comprising:
a) operably coupling a radio frequency (RF) input of a matching network to an RF source, and operably coupling an RF output of the matching network to a plasma chamber, wherein the matching network comprises:
i) a first reactance element configured to provide a variable first reactance element position, the first reactance element position controlling the total reactance provided by the first reactance element; and
ii) a second reactance element configured to provide a variable second reactance element position, the second reactance element position controlling the total reactance provided by the second reactance element;
b) detecting, by a sensor, a value related to the plasma chamber or the matching network;
c) determining a first parameter of the matching network based on the detected value;
d) determining first two-port parameters from a first one-dimensional array that corresponds to a first portion of the matching network using the first reactance element position;
e) determining second two-port parameters from a second one-dimensional array that corresponds to a second portion of the matching network using the second reactance element position, the second portion of the matching network being distinct from the first portion;
f) calculating an output parameter of the RF output based on the first parameter, the first two-port parameters, and the second two-port parameters;

g) determining a new first reactance element position and a new second reactance element position from a match position table using the calculated output parameter; and h) altering the first reactance element to the new first reactance element position, and altering the second reactance element to the new second reactance element position to reduce a reflected power.

12. The method of claim 11:
wherein the detected value comprises at least one of a voltage, a current, or a phase at the RF input; and
wherein the first parameter is an input impedance at an RF input of the impedance matching network.

13. The method of claim 11 wherein each one-dimensional array comprises, for each potential reactance element position, corresponding two-port parameters.

14. The method of claim 11 wherein each of the first reactance element and the second reactance element is a variable capacitor whose total reactance is a total capacitance, or each is a variable inductor whose total reactance is a total inductance.

15. The method of claim 11 wherein each of the first reactance element and the second reactance element is an electronically variable capacitor (EVC), each EVC comprising discrete capacitors configured to switch in and out to enable the EVC to provide the variable first reactance element position or the variable second reactance element position.

16. The method of claim 11 wherein the match position table comprises, for each of a plurality of output parameters, corresponding new first and second reactance element positions that would cause a desired input parameter at the RF input.

17. The method of claim 11 wherein the corresponding new first and second reactance element positions that would cause the desired input parameter is determined by:
calculating an input impedance at the RF input for each of the plurality of output parameters using the two-port parameters; and
calculating a reflection value for each calculated input impedance, the desired input parameter being the lowest reflection value.

18. The method of claim 17 wherein the reflection value is a reflection coefficient at the RF input of the matching network.

19. The method of claim 11 wherein the matching network comprises more than two variable reactance elements.

20. A method of manufacturing a semiconductor, the method comprising:
placing a substrate in a plasma chamber configured to deposit a material layer onto the substrate or etch a material layer from the substrate; and
operably coupling a radio frequency (RF) input of a matching network to an RF source, and operably coupling an RF output of the matching network to the plasma chamber, wherein the matching network comprises:
a first reactance element configured to provide a variable first reactance element position, the first reactance element position controlling the total reactance provided by the first reactance element; and
a second reactance element configured to provide a variable second reactance element position, the second reactance element position controlling the total reactance provided by the second reactance element;
detecting, by a sensor, a value related to the plasma chamber or the matching network;
determining a first parameter of the matching network based on the detected value;
determining first two-port parameters from a first one-dimensional array that corresponds to a first portion of the matching network using the first reactance element position;
determining second two-port parameters from a second one-dimensional array that corresponds to a second portion of the matching network using the second reactance element position, the second portion of the matching network being distinct from the first portion;
calculating an output parameter of the RF output based on the first parameter, the first two-port parameters, and the second two-port parameters;
determining a new first reactance element position and a new second reactance element position from a match position table using the calculated output parameter; and
altering the first reactance element to the new first reactance element position, and altering the second reactance element to the new second reactance element position to reduce a reflected power.

* * * * *